United States Patent
D'Souza et al.

(10) Patent No.: US 9,319,495 B2
(45) Date of Patent: Apr. 19, 2016

(54) POWER AMPLIFIER PROVIDING HIGH EFFICIENCY

(71) Applicant: Aura Semiconductor Pvt. Ltd., Bangalore (IN)

(72) Inventors: Arnold J D'Souza, Bangalore (IN); Hariharan Srinivasan, Chennai (IN); Shyam Somayajula, Bangalore (IN)

(73) Assignee: AURA SEMICONDUCTOR PVT. LTD, Bangalore (IN)

( * ) Notice: Subject to any disclaimer, the term of this patent is extended or adjusted under 35 U.S.C. 154(b) by 0 days.

(21) Appl. No.: 14/449,156

(22) Filed: Aug. 1, 2014

(65) Prior Publication Data

US 2015/0045095 A1    Feb. 12, 2015

(30) Foreign Application Priority Data

Aug. 6, 2013   (IN) .......................... 3527/CHE/2013

(51) Int. Cl.
*H04B 1/00*    (2006.01)
*H04M 1/02*    (2006.01)
(Continued)

(52) U.S. Cl.
CPC ........... *H04M 1/0202* (2013.01); *H03F 1/0227* (2013.01); *H03F 3/187* (2013.01); *H03F 3/68* (2013.01); *H03F 2200/03* (2013.01)

(58) Field of Classification Search
CPC ........ H04N 1/32561; H04N 5/60; H04N 5/63
USPC .............................................. 455/194.2, 219
See application file for complete search history.

(56) References Cited

U.S. PATENT DOCUMENTS 5,777,519 A    7/1998   Simopoulos
5,990,751 A    11/1999  Takita
(Continued)

FOREIGN PATENT DOCUMENTS

EP    2280479 B1    2/2011
EP    2382706 A1    11/2011
GB    2484475 A     4/2012

OTHER PUBLICATIONS

"LM48580 Boomer™ Audio Power Amplifier Series High Efficiency Class H, High Voltage, Haptic Piezo Actuator / Ceramic Speaker Driver", http://www.ti.com/general/docs/lit/getliterature.tsp?literatureNumber=snas491a&fileType=pdf, dated: Feb. 2010—Revised May 2013, pp. 1-19.

(Continued)

*Primary Examiner* — Tu X Nguyen
(74) *Attorney, Agent, or Firm* — IP Horizons PLLC; Narendra Reddy Thappeta

(57) ABSTRACT

A power amplifier containing a DC-DC converter, a linear amplifier and a control block. The DC-DC converter receives power from a power source and generates a regulated power supply voltage whose magnitude is controlled by the magnitude of a control signal provided to the DC-DC converter. The linear amplifier receives an input signal and generates a power-amplified output signal, and receives the regulated power supply voltage for operation. The control block is coupled to receive the input signal, and generates the control signal with a magnitude based on the amplitude of the input signal. The regulated power supply voltage is modulated based on the amplitude of the input signal, for peak-to-peak amplitudes of the power-amplified output greater than or less than or equal to the magnitude of the power source. High efficiency for the power amplifier is thereby obtained.

19 Claims, 14 Drawing Sheets

(51) Int. Cl.
  *H03F 3/187* (2006.01)
  *H03F 1/02* (2006.01)
  *H03F 3/68* (2006.01)

(56) References Cited

U.S. PATENT DOCUMENTS

| | | |
|---|---|---|
| 6,417,736 B1 | 7/2002 | Lewyn |
| 6,914,487 B1 | 7/2005 | Doyle |
| 7,321,262 B2 | 1/2008 | Nielsen |
| 7,750,732 B1 | 7/2010 | Delano |
| 8,279,001 B2 | 10/2012 | French |
| 8,295,792 B2 | 10/2012 | Chan |
| 2008/0003962 A1 | 1/2008 | Ngai |
| 2014/0169588 A1* | 6/2014 | Petersen ............ H03F 3/68 381/120 |

OTHER PUBLICATIONS

"Amplifier", http://en.wikipedia.org/wiki/Electronic_amplifier#Classes_G_and_H , Dated: Download circa Jun. 20, 2013, pp. 1-25.

"Maxim Low-Power, Low-Offset, Dual Mode, Class H DirectDrive Headphone Amplifier", http://datasheets.maximintegrated.com/en/ds/MAX97200.pdf, Dated: Aug. 2012 pp. 1-13.

"NTE7220 Integrated Circuit Audio Power Amp, 70W/Ch", NTE Electronics, Inc, dated :Year .2002, pp. 1-2.

"70 W high efficiency power amplifier with diagnostic facility", Philips Semiconductors, dated: Feb. 12, 2003, pp. 1-24.

Ronan Van Der Zee, "High Efficiency Audio Power Amplifiers design and practical use", Proefschrift, ISBN: 90-36512875, dated: Copyright 1999, pp. 1-128.

* cited by examiner

POWER AMPLIFIER PROVIDING HIGH EFFICIENCY

PRIORITY CLAIM

The instant patent application is related to and claims priority from the co-pending provisional India patent application entitled, "POWER AMPLIFIER PROVIDING HIGH EFFICIENCY", Serial No.: 3527/CHE/2013, Filed: 6 Aug. 2013, which is incorporated in its entirety herewith to the extent not inconsistent with the description herein.

BACKGROUND

1. Technical Field

Embodiments of the present disclosure relate generally to power amplifiers, and more specifically to a power amplifier providing high efficiency.

2. Related Art

Power amplifiers provide power-amplification to signals driving corresponding transducers (or loads in general). For example, a power amplifier used in audio applications provides power amplification for an audio signal delivered into a low impedance speaker. In general, a power amplifier receives an input signal and generates an output signal with a power (product of voltage and current) greater than that of the input signal.

Efficiency of a power amplifier is a ratio of the total power delivered to the output of the power amplifier in the audio band to the total power drawn from the power supply powering the power amplifier. It is generally desirable that a power amplifier be designed to provide high efficiency, while also satisfying one or more other requirements.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A power amplifier contains a DC-DC converter, a linear amplifier and a control block. The DC-DC converter receives power from a power source and generates a regulated power supply voltage whose magnitude is controlled by the magnitude of a control signal provided to the DC-DC converter. The linear amplifier receives an input signal and generates a power-amplified output signal, and receives the regulated power supply voltage for operation. The control block is coupled to receive the input signal, and generates the control signal with a magnitude having a positive correlation with the amplitude of the input signal. The operation of the control block in conjunction with DC-DC converter causes the regulated power supply voltage to vary based on the amplitude of the input signal when the amplitude of the power-amplified output signal is in a first range less than a magnitude (voltage) of the power source, as well as when the amplitude of the power-amplified output signal is in a second range greater than or equal to the magnitude of the power source. As the voltage drop across the devices in the linear amplifier is minimized by modulating the supply, high efficiency for the power amplifier is thereby obtained.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Power Amplifier

Figure 1:
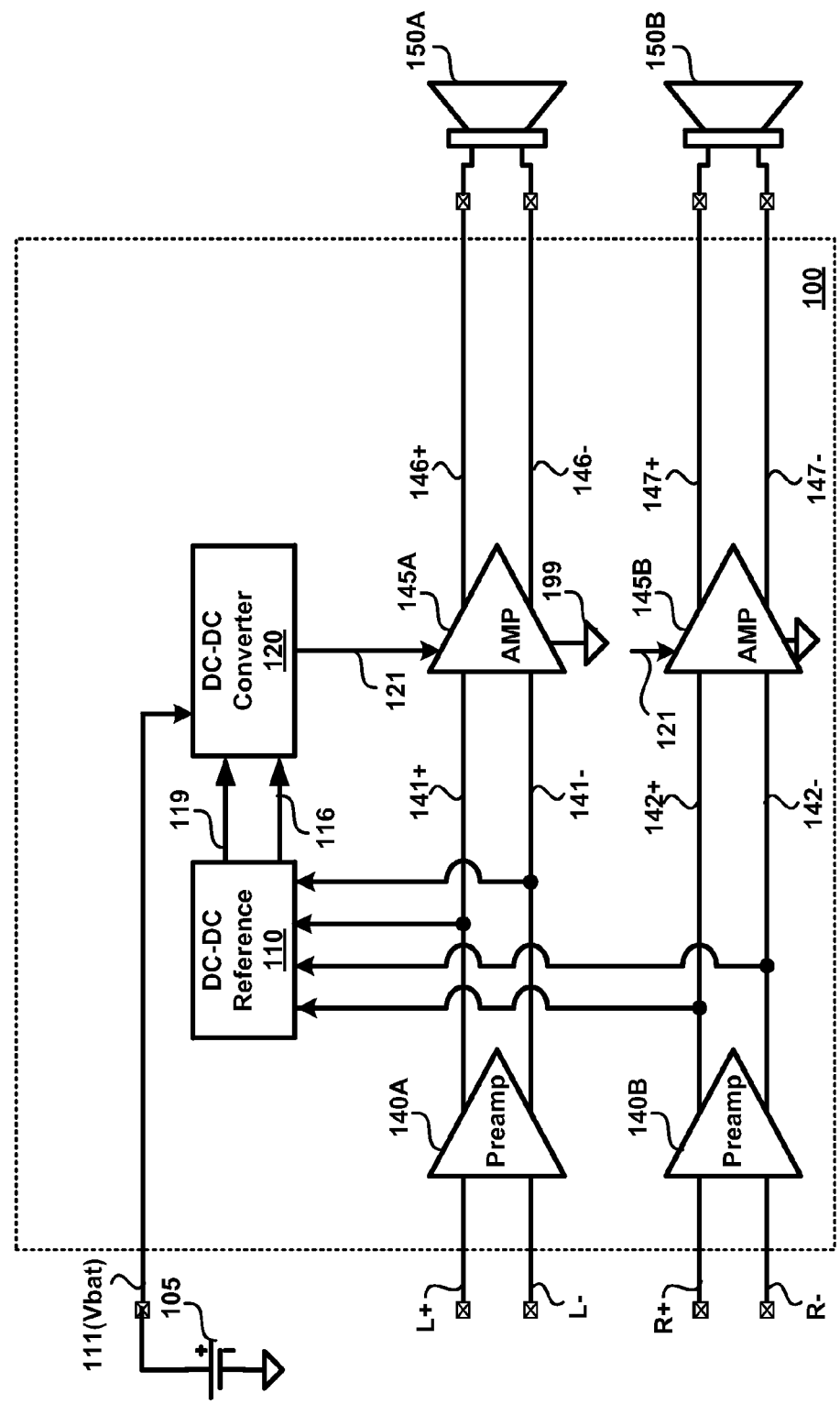
FIG. 1 is a block diagram of a power amplifier in an embodiment of the present disclosure.

FIG. 1 is a block diagram of a power amplifier in an embodiment of the present disclosure. Merely for illustration, the description of the power amplifier below is provided in the context of audio applications. As is well known in the relevant arts, audio applications involve processing (e.g., amplification) of audio signals. Audio signals may include content such as speech and music, and the band of frequencies of an audio signal generally lies in the range of 0 Hertz to 20 Kilo Hertz. However, a power amplifier implemented according to several aspects of the present disclosure can be used in other application also, such as for example, haptic (tactile feedback), piezo speakers, buzzer applications, and RF power amplifiers.

Power amplifier 100 is shown containing DC-DC reference 110, DC-DC converter 120, preamplifiers 140A and 140B, and linear amplifiers 145A and 145B. Also shown are battery 105, and speakers 150A and 150B. In an embodiment, power amplifier 100 is implemented in integrated circuit (IC) form, while the blocks and components of FIG. 1 may be implemented, for example, within a mobile phone.

DC-DC converter 120 represents a switching regulator, which receives an input voltage 111 (Vbat) from battery 105, and generates a regulated output voltage 121 (regulated power supply voltage). The specific magnitude of regulated power supply voltage 121 is controllable by the value of signal 116, as described in sections below. Signal 116 can have a magnitude greater than/less than or equal to Vbat (first power supply voltage). Although the source of power is noted as being obtained from battery 105, in other embodiments, any unregulated or regulated power source may be used as the source of power to DC-DC converter 120. For example, the source of input power to DC-DC converter 120 may be the regulated output of another switching regulator or linear regulator.

In an embodiment, DC-DC converter 120 is designed to be configurable (on the fly) to operate either as a buck-only, buck-boost, or as a boost-only converter. In the buck-only mode, output voltage 121 is always less than input voltage 111, while in the buck-boost mode, output voltage 121 may be greater than, equal to, or less than input voltage 111. In the boost-only mode, output voltage 121 is always greater than input voltage 111.

The ability to operate (on the fly) as either a buck-only, as a boost-only or as a buck-boost converter enables power amplifier 100 to be used in instances even when the terminal voltage of battery 105 falls below the desired magnitude of power supply voltage 121. Such ability may be advantageous in several deployment systems such as a mobile phone and other battery-powered systems. The implementation details of DC-DC converter 120 in an embodiment are described in sections below.

Each of preamplifiers 140A and 140B receives as inputs audio signals (electrical/analog signals representing audio/sound information) on respective left and right channels (represented by respective differential paths L+/L− and R+/R−) of an audio system. Preamplifiers 140A and 140B amplify the respective input audio signals to generate respective (analog) amplified signals on differential paths 141+/141− and 142+/142− respectively. In an embodiment, each of preamplifiers 140A and 140B is implemented as a transconductance amplifier. Preamplifiers 140A and 140B receive a fixed power supply voltage for operation from a regulated power supply either internal to (not shown) power amplifier 100 or an external power supply (also not shown). In another embodiment, preamplifiers 140A and 140B are not implemented, and instead, signals L+/L− and R+/R− are directly provided as inputs to linear amplifiers 145A and 145B respectively.

Amplifiers 145A and 145B receive respective signals 141+/141− and 142+/142− and operate to provide corresponding buffered signals (146+/146− and 147+/147− respectively) as output signals (power-amplified output signals), which respectively drive respective speakers 150A and 150B. The combination of preamplifier 140A, amplifier 145A and speaker 150A represents the 'left' audio channel in a stereophonic system. Similarly, the combination of preamplifier 140B, amplifier 145B and speaker 150B represents the 'right' audio channel in the stereophonic system.

In an embodiment, each of amplifiers 145A and 145B is designed for single-supply operation and receives power for operation from power supply voltage 121. Thus, power supply voltage 121 may be applied to a power-supply terminal of each of amplifiers 145A and 145B. Each of amplifiers 145A and 145B may be implemented as a linear amplifier (class AB, class A or class B amplifier). In another embodiment, one or both of amplifiers 145A and 145B are implemented to operate using positive and negative supplies (dual supply operation).

DC-DC reference 110 may be powered by a regulated power supply (not shown) of a suitable magnitude, generated internally in IC 100. DC-DC reference 110 operates in analog fashion (and thus continuously, as against in discrete steps or discrete time), receives signals 141+, 141−, 142+ and 142−, and is designed to generate a control signal 116 equaling (or in general having a positive correlation with) the maximum of the (corresponding instantaneous) magnitudes of the signals 141+, 141−, 142+ and 142−. Positive correlation implies that the magnitude of the control signal increases when the amplitude of the input signal increases, and decreases when the amplitude of the input signal decreases. In an embodiment, the positive correlation noted above is direct proportionality.

In the embodiment in which preamplifiers 140A and 140B are not implemented, signals L+/L− and R+/R− may be directly provided as inputs to DC-DC reference 110, which operates to generate control signal 116 equaling (or in general having a positive correlation with) the maximum of the (corresponding instantaneous) magnitudes of the signals L+, L−, R+ and R−instead of signals 141+, 141−, 142+ and 142−.

In general, DC-DC reference 110 is coupled to receive signals representative of the magnitudes of input audio signals (L+/L− etc.), and to generate control signal 116 to control the magnitude of the regulated power supply 121. In the embodiment of FIG. 1, while DC-DC reference 110 is shown and described as operating in analog fashion based on input audio signals received in analog form, in another embodiment (described below) a control block may instead be coupled to receive input audio signals in digital form, process the digital data, and to generate control signal 116.

Figure 6:
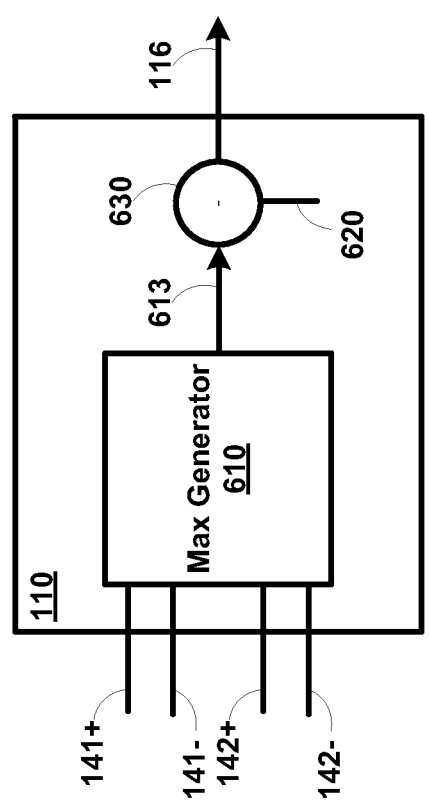
FIG. 6 is a diagram illustrating the details of a DC-DC reference used in a power amplifier in an embodiment of the present disclosure.

FIG. 6 shows the implementation of DC-DC reference 110 in an embodiment. Max generator 610 forwards on output path 613 the maximum of the magnitudes of the signals 141+, 141−, 142+ and 142−. The common mode voltage value provided at terminals 141+, 141−, 142+ and 142− is provided on path 620. Subtract block 630 subtracts common mode value 620 from signal 613, and provides the difference as signal 116. As noted above, in one embodiment, signal 116 is directly provided to DC-DC converter 120, and controls the magnitude of power supply voltage 121. Since the magnitude of signal 116 has a positive correlation with respect to the maximum of signals 141+, 141−, 142+ and 142−, the control of power supply voltage 121 by signal 116 causes the magnitude of power supply voltage 121 to continuously (as against in discrete steps or in discrete time slots) follow (or track) the maximum of signals 141+, 141−, 142+ and 142−.

It is noted that the specific magnitude of signal 116 may be dependant on the gain scaling of DC-DC converter 120. Thus, for example, if DC-DC converter 120 has a gain of 2, the magnitude of signal 116 may need to be only half the value it may otherwise need to be if the gain of DC-DC converter 120 has a gain of 1. In general, DC-DC converter 120 may be implemented with a gain (ratio of magnitude of supply 121 to magnitude of control signal 116) such that supply 121 is enabled to track (be equal to or slightly greater than) the (instantaneous) magnitude of the maximum of the output signals 146+/146− and 147+/147−. The manner in which such gain may be implemented would be well known to one skilled in the relevant arts, upon reading the disclosure herein. Alternatively, the power supply voltage provided for operation of DC-DC reference 110 may be designed to be suitably large enough, or DC-DC reference 110 may itself be designed to provide the requisite gain. Max generator 610 may be implemented similar to Max generator 310 described below with respect to FIGS. 3 and 5.

Since the output signals 146+, 146−, 147+ and 147− are amplified/buffered version of signals 141+, 141−, 142+ and 142−, it may be appreciated that tracking (or modulation) of power supply voltage 121 is achieved with respect to the output signals 146+, 146−, 147+ and 147− as well. As noted above, the gain provided by DC-DC converter 120 ensures that supply voltage 121 is at least equal to the magnitude of the maximum of output signals 146+, 146, 147+ and 147−, although only the corresponding input audio signals 141+, 141−, 142+ and 142− are actually tracked by DC-DC converter 110, as also noted above.

Such power supply modulation enables power amplifier 100 to achieve high levels of efficiency, since the power consumed (or dropped across) the corresponding pass transistor(s) within amplifiers 145A and 145B is minimized. In an embodiment of the present disclosure, power supply modulation is performed irrespective of whether the peak-to-peak amplitude of any (or of the maximum) of the output signals 146+, 146−, 147+ and 147− is less then Vbat (111) or greater than or equal to Vbat(111).

Figure 9A:
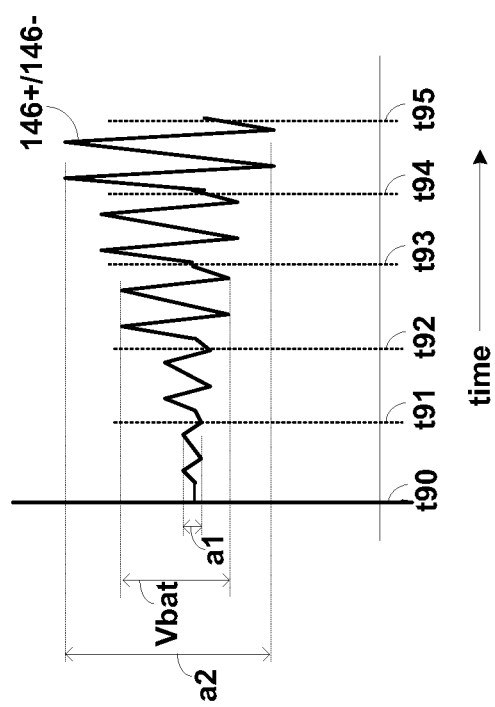
FIG. 9A is an example diagram illustrating the variations in the peak-to-peak amplitudes of an output signal of a power amplifier in an embodiment of the present disclosure.

FIG. 9A is an example diagram showing variations in differential output signal 146+/146−. Example peak-to-peak amplitudes of differential signal 146+/146− are shown there. In time intervals t90-t91 and t91-t92, the peak-to-peak amplitudes (e.g., a1) are indicated to be less then the magnitude of the battery voltage Vbat (111 in FIG. 1), while in intervals t92-t93, t93-t94 and t94-t95 the peak-to-peak amplitudes (e.g., a2) are either equal to or greater than Vbat. Although not shown in FIG. 9A, regulated power supply output 121 continuously tracks (in the manner illustrated in the example of FIG. 2, and with an appropriate headroom) differential signal 146+/146− for all peak-to-peak amplitudes of differential signal 146+/146− in all intervals t90-t91, t91-t92, t92-t93, t93-t94 and t94-t95. Thus, the power supply modulation noted above is performed for all peak-to-peak amplitudes, irrespective of whether the peak-to-peak amplitude is less than or greater than or equal to Vbat. Thus, power supply voltage 121 is modulated (tracked) even in intervals t90-t91 and t91-t92 when the peak-to-peak amplitude is less than Vbat. Further, the power supply modulation is achieved even when the instantaneous amplitude of any of the output signals is less than Vbat, or greater than or equal to Vbat. Thus, modulation of power supply 121 is performed irrespective of the instantaneous values of the output signals also.

Thus, power supply modulation of the present disclosure may also be viewed as being performed over all or some of the entire peak-to-peak amplitude range (zero to full scale) of output signals 146+, 146−, 147+ and 147−, i.e., irrespective of the peak-to-peak amplitude of any of the output signals 146+, 146−, 147+ and 147−. The maximum possible (or full-scale) peak-to-peak value of any of signals 146+, 146−, 147+ and 147− is generally determined by the maximum possible value of power supply voltage 121.

While the operation of DC-DC reference 110 and DC-DC converter 120 ensures the control of the magnitude of supply 121 to equal (or be slightly greater than) the magnitude of the maximum of output signals 146+, 146, 147+ and 147−, in practice, it may be desirable to maintain a 'headroom' between the supply 121 and the magnitude of the maximum of output signals 146+, 146, 147+ and 147−, as described next.

3. Adaptive Headroom Control

'Headroom' is the (voltage) margin between the magnitudes of power supply 121 and the instantaneous value of the maximum of the output signals 146+, 146−, 147+ and 147−. Such a margin may be required to ensure that none output signals 146+/146− and 147+/147− is ever clipped or distorted.

Clipping or distortion of one or both of output signals 146+/146− and 147+/147− may occur due to delay in the response of DC-DC converter 110 to changes in control signal 116, offsets between left and right channel pre-amplifiers 145A and 145B, common mode and differential offsets of pre-amplifiers 140A, 140B and amplifiers 145A and 145B, etc. Such clipping may be of particular concern at higher frequencies of operation (closer to the upper limit of the audio range, i.e., 20 KHz) and for large output signal amplitudes, since DC-DC converter 120 has a finite bandwidth and slew-rate.

Figure 10:
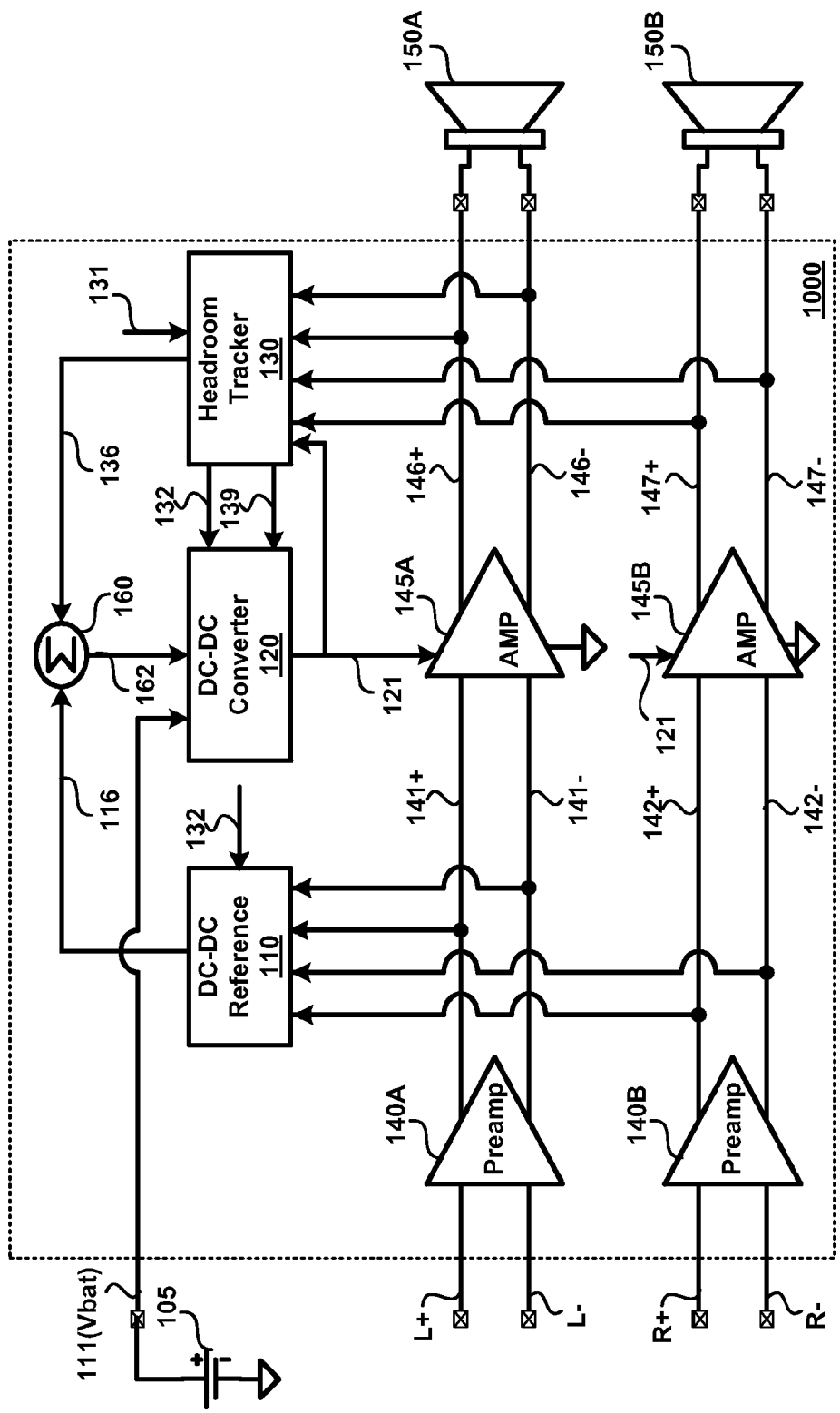
FIG. 10 is a block diagram of a power amplifier in another embodiment of the present disclosure.

Accordingly, in another embodiment of the present disclosure, illustrated in FIG. 10 which is shown containing power amplifier 1000, battery 105 and speakers 150A and 150B, headroom tracker 130 and summation block 160 implemented in addition to the other blocks of FIG. 1 to enable adaptive headroom control. Although shown as separate blocks, the operations of DC-DC reference 110 and headroom tracker 130 can be combined in a single block. It is noted here that even when adaptive headroom control is used as described below, modulation of power supply voltage 121 is performed irrespective of whether the peak-to-peak amplitude of any (or of the maximum) of the output signals is less then Vbat (111) or greater than or equal to Vbat (111). Headroom tracker 130 may be powered by a regulated power supply (not shown), but generated internally in IC 100.

According to the adaptive headroom control technique, headroom tracker 130 continuously (in analog fashion) compares the value of power supply voltage 121 with the maximum of the (absolute values of) the amplitudes of output signals 146+, 146−, 147+ and 147−, and generates a corresponding difference signal. The difference signal may have a magnitude equal to (or in general have a positive correlation with) the difference between the magnitudes of power supply voltage 121 and the maximum of (absolute values of) the amplitudes of output signals 146+, 146, 147+ and 147−.

The difference is compared with a nominal (programmed) headroom value (e.g., 100 mV) received as signal 131, and the difference is amplified (by amplifier 330 noted below) with a gain that is based on the gain scaling of DC-DC converter 120, to generate signal 136. Thus, for example, if DC-DC converter 120 has a gain of 2, the magnitude of signal 136 may need to be only half the value it may otherwise have to be if the gain of DC-DC converter 120 has a gain of 1. The specific value of the headroom (131) may be programmable. Signal 136 can be greater than/less than or equal to Vbat (first power supply voltage).

Figure 3:
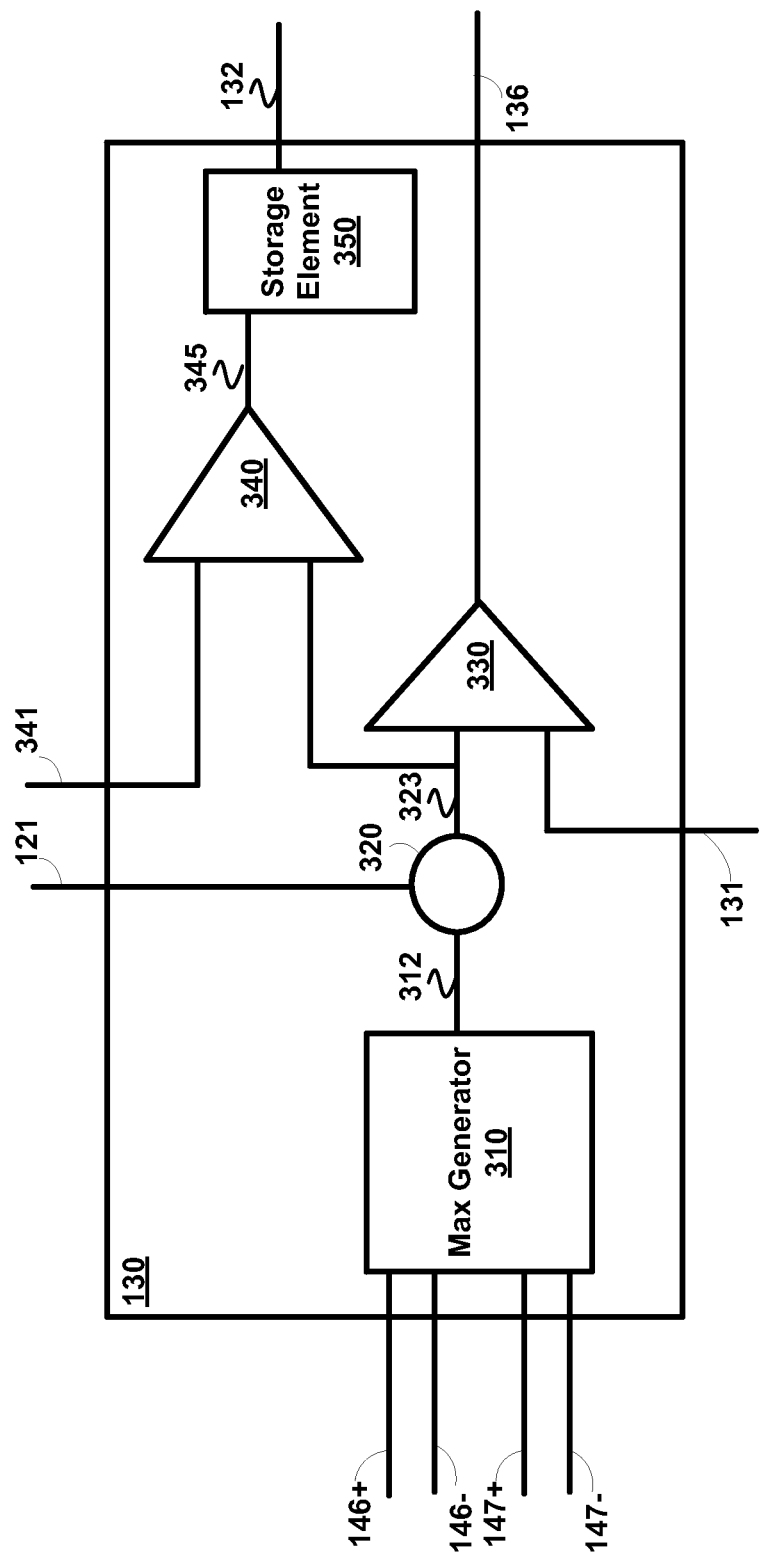
FIG. 3 is a block diagram of a headroom tracker used in a power amplifier in an embodiment of the present disclosure.

FIG. 3 illustrates the blocks of headroom tracker 130, in an embodiment of the present disclosure. Max generator 310 receives output signals 146+, 146−, 147+ and 147−, and generates signal 312 with a magnitude equaling the maximum of the four output signals. Subtraction block 320 subtracts signal 312 from the power supply voltage 121. Amplifier 330 compares the difference voltage 323 with a programmable headroom voltage 131, and provides the amplified difference (suitably amplified depending on the gain scaling of DC-DC converter 120 as noted above) between signals 323 and 131 as signal 136.

Summation block 160 adds the signals 116 and 136 to generate a final control signal 162, which is provided to DC-DC converter 120. The magnitude of control signal 162 controls the magnitude of power supply voltage 121. The operation of headroom tracker 131 strives to maintain a constant value of headroom voltage between power supply voltage 121 and the (maximum of) output signals 146+, 146−, 147+ and 147−, thereby minimizing the probability of clipping or distortion in one or both of output signals 146+, 146−, 147+ and 147−.

Figure 2:
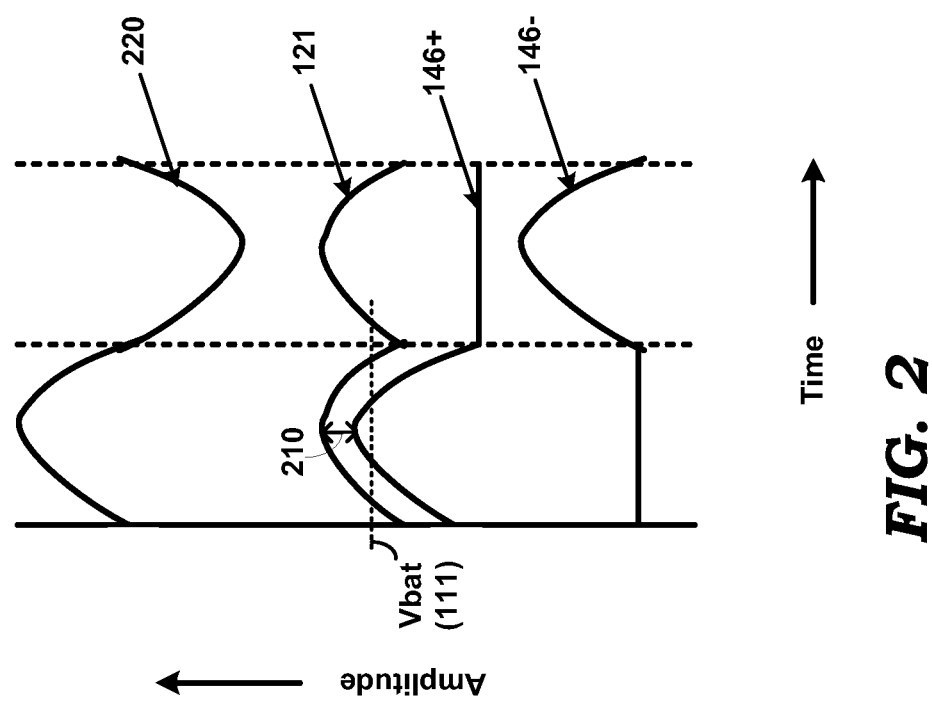
FIG. 2 is an example diagram illustrating the manner in which the power supply voltage of a power amplifier is modulated in an embodiment of the present disclosure.

FIG. 2 is an example diagram illustrating the manner in which power supply voltage 121 tracks the output audio signals with a headroom. For simplicity, in FIG. 2 only signals 146+ and 146− are shown. It is also assumed that each of signals 146+ and 146− is a half sine wave needed for the ease of supply modulation, which together differentially represent a sine wave 220, as illustrated in FIG. 2. Power supply voltage 121 is shown tracking the maximum of signals 146+ and 146−. Although a single tone (pure sine wave) is shown in the illustration of FIG. 2, such tracking may be provided over the entire range of audio frequencies (20 Hz to 20 KHz) of signals 146+, 146−, 147+ and 147−. Marker 210 in FIG. 2 represents the instantaneous difference between power supply voltage 121 and the voltage of the maximum (greatest) of signals 146+, 146−, 147+ and 147−, and represents the 'headroom'.

Figure 4:
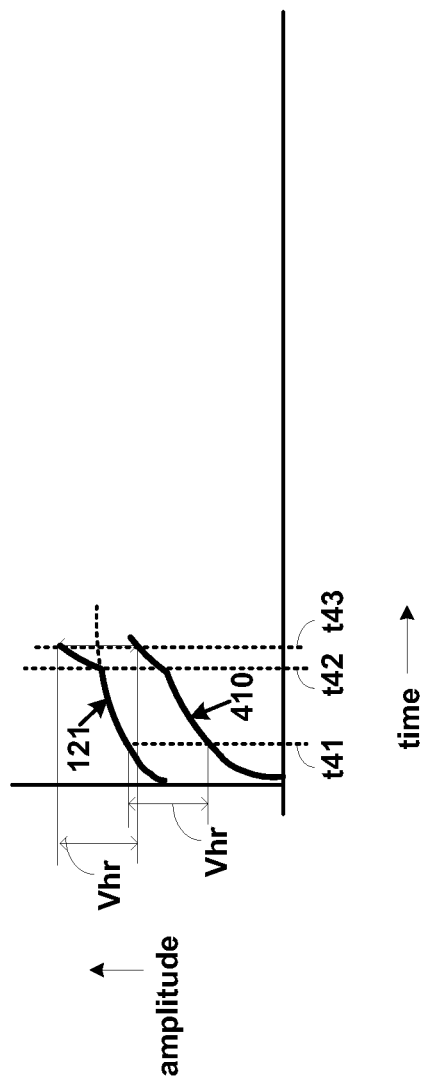
FIG. 4 is a diagram illustrating the manner in which adaptive headroom is provided for a power supply voltage used in a power amplifier in an embodiment of the present disclosure.

FIG. 4 is another example diagram illustrating the manner in which the headroom is controlled adaptively in an embodiment of the present disclosure. Signal 410 is assumed to represent the maximum among the output signals 146+, 146−, 147+ and 147− The nominal value of headroom is indicated by Vhr. Power supply voltage 121 is shown as 'tracking' signal 410 with an approximately constant headroom voltage of magnitude Vhr (indicated at time t41) till time instant t42. At (or slightly after) t42, the rate of change of signal 410 increases. As a result, the headroom voltage (the difference between voltages of power supply 121 and that of signal 410) becomes less than Vhr. However, the operation of headroom tracker attempts to maintain a constant headroom by causing power supply voltage 121 to also follow the new rate of change, and to increase the headroom back to Vhr, as indicated at time t43.

Such adaptive headroom control may be needed to minimize clipping or distortion in output signals 146+/146−, and 147+/147−. However, in another embodiment, if the magnitude of difference signal 323 falls below a desired minimum headroom provided on path 341, headroom tracker 130 is designed to generate an error signal. Such situation may occur when the rate of change of any of output signals 146+, 146−, 147+ and 147− is so high (e.g., full scale amplitude at 20 KHz) that the corresponding blocks of FIG. 10 that generate power supply 121 are not able to respond to the rate of change due to non-zero time required for the feedback loops controlling supply 121 to respond to the change(s) in the output audio signals.

Error signal 132 (shown in FIG. 10), when active, causes DC-DC converter 120 to generate a fixed value (e.g., the maximum possible value) of power supply voltage 121, or causes DC-DC converter 120 to transition to class G operating mode. In class G operation mode, in which DC-DC converter 120 generates supply 121 with a magnitude equal to a corresponding one of several (discrete) rail voltages and switches between the rail voltages based on the magnitude (peak envelope in one embodiment) of audio output signals. The specific manner in which DC-DC converter 120 may be caused to generate a fixed value of power supply voltage 121, or operate in class G mode, based on error signal 132 would be well known to one skilled in the relevant arts. For example, when error signal 132 is asserted, a fixed voltage value may be fed to subtraction block 320 in place of signal 312.

Referring again to FIG. 3, comparator 340 receives signal 323 and a threshold voltage 341. Threshold voltage 341 indicates the lower limit (e.g., 50 mV) of the allowed headroom. If signal 323 falls below threshold voltage 341, the output of comparator is asserted/active, and error signal 345 is latched in storage element 350, and provided as error signal 132. Storage element 350 may be cleared (for example, by a timer circuitry, not shown) once signal 323 rises above threshold voltage 341, and remains greater than threshold voltage 341 for a pre-determined duration of time (commonly referred to as 'release time'). The implementation of such circuitry (or other approaches for resetting storage element 350) would be well known to one skilled in the relevant arts. Once storage element 350 is cleared, power supply voltage 121 resumes tracking of the maximum of the output voltages 146+, 146−, 147+ and 147−, according to the continuous modulation operation as described in detail above.

Figure 5:
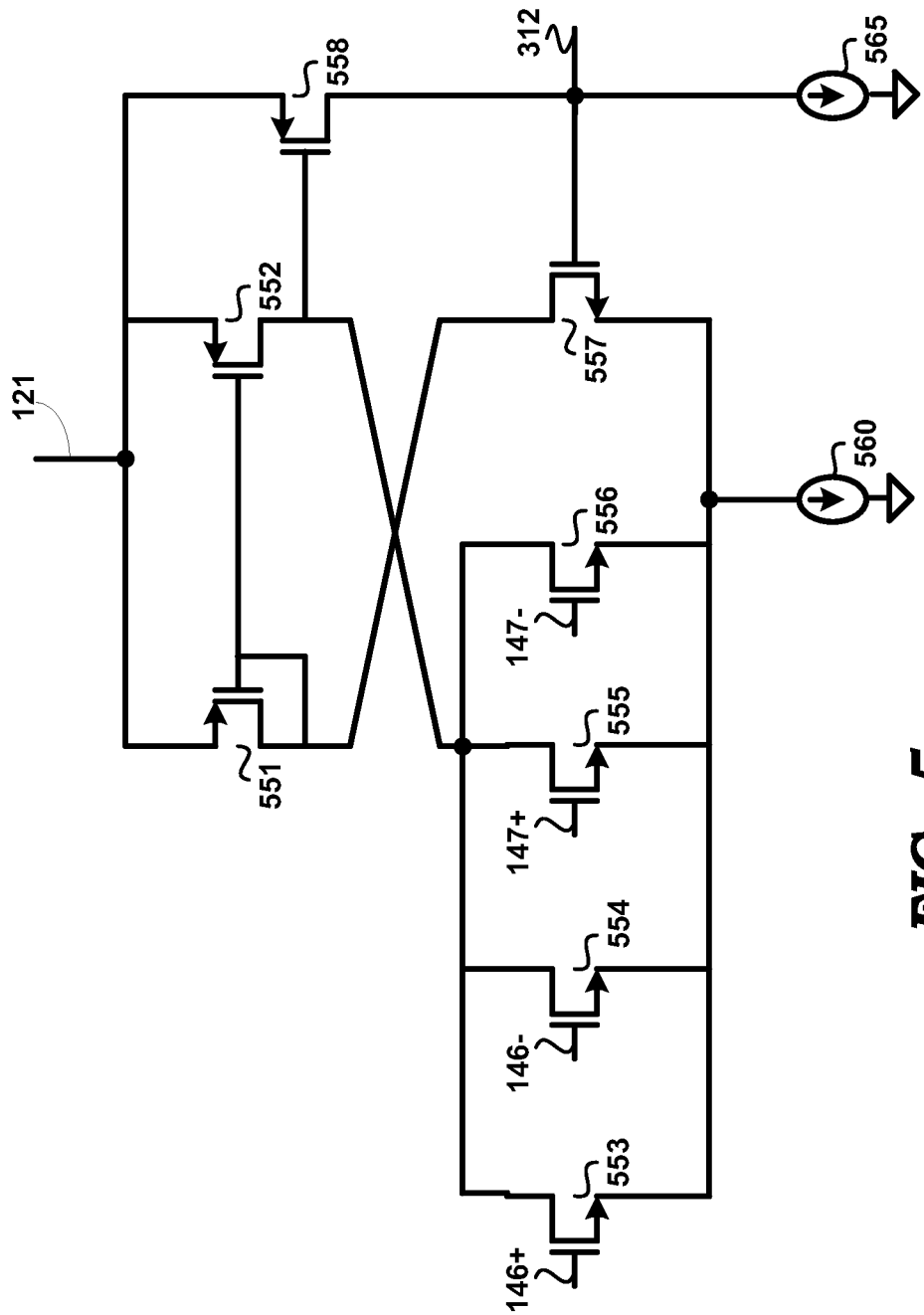
FIG. 5 is a circuit diagram illustrating the implementation details of a maximum-signal-generator used in a power amplifier in an embodiment of the present disclosure.

FIG. 5 is a diagram illustrating the implementation details of Max generator 310 (of FIG. 3) in an embodiment. Components 560 and 565 represent current sources. Transistors 553, 554, 555 and 556 respectively receive output signals 146+, 146−, 147+ and 147−. The combination of transistors 551, 552, 557 and 558 operates as an amplifier, and provides signal 312 as the maximum (or proportional to the maximum) of output signals 146+, 146−, 147+ and 147−. The operation of the circuit of FIG. 5 would be well known to one skilled in the relevant arts.

In another embodiment, the headroom (e.g., Vhr in FIG. 4, or 210 in FIG. 2) can be made load current dependent. Load current refers to the current supplied by amplifiers 145A and 145B on respective outputs 146+/146− and 147+/147−. For larger load currents the programmed headroom (received on path 131) is made larger since the overdrive of the driver transistors (of the linear amplifiers) becomes larger. Similarly for smaller load currents the headroom is made smaller. This method of programming headroom provides good linearity of the linear amplifiers in addition to high efficiency. In yet another embodiment, the headroom can be varied in accordance with the slew rate of the audio output signals.

The implementation details of DC-DC converter 120 are described next with respect to an embodiment.

4. DC-DC Converter

Figure 7:
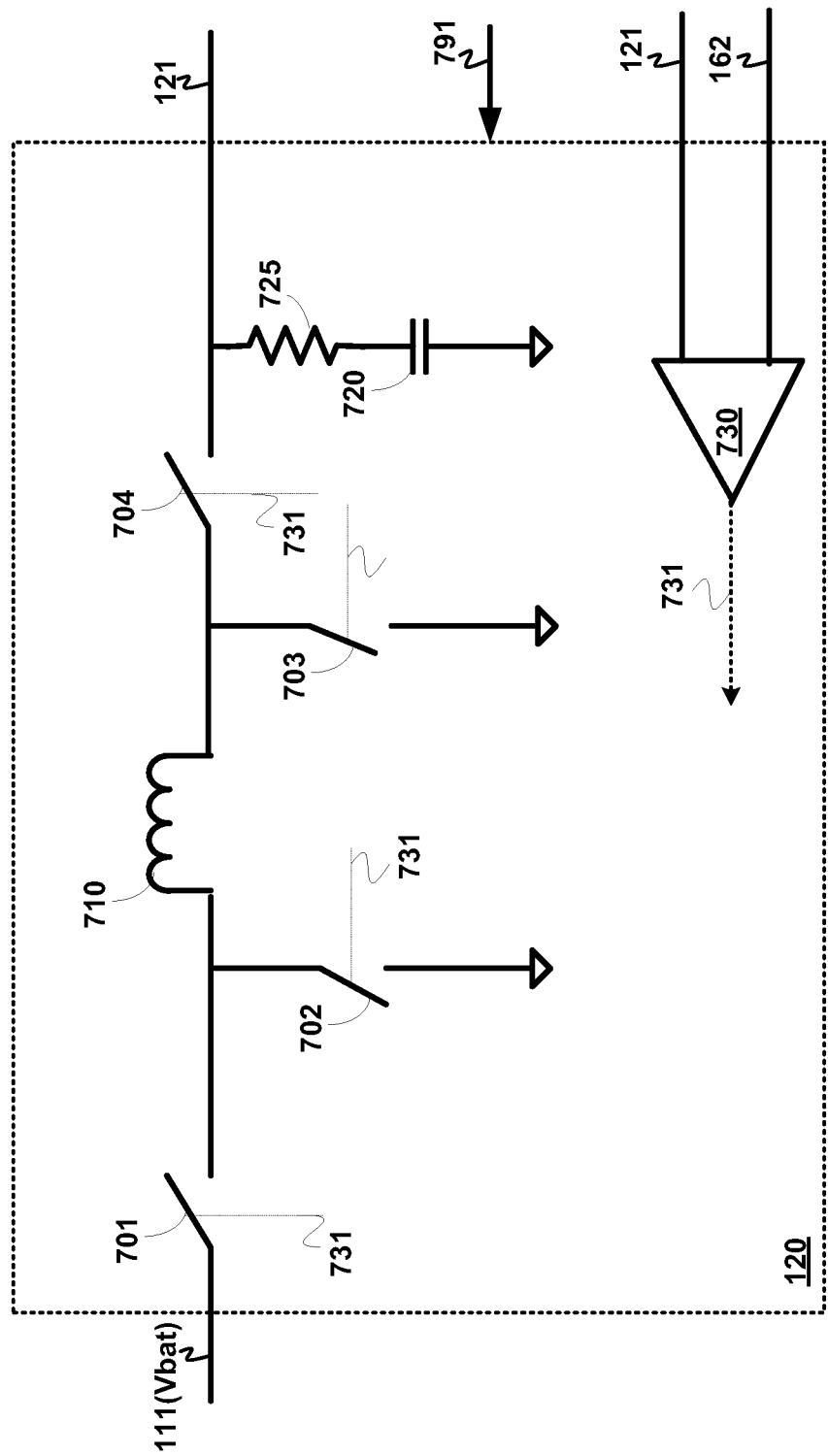
FIG. 7 is a diagram illustrating the details of a DC-DC converter used in a power amplifier in an embodiment of the present disclosure.

FIG. 7 is a diagram illustrating the implementation details of DC-DC converter 120 in an embodiment of the present disclosure. DC-DC converter 120 is shown containing switches 701, 702, 703 and 704, inductor 710, resistor 725, capacitor 720, and comparator 730. Inductor 710 may be implemented as a single inductor, or as multiple inductors in parallel or series. In an embodiment, DC-DC converter 120 is designed to operate as a hysteretic converter. The output 731 of comparator 730 is processed by circuitry (not shown, but which would be apparent to one skilled in the relevant arts) to appropriately control the opening and closing of switches 701-704.

Figure 11:
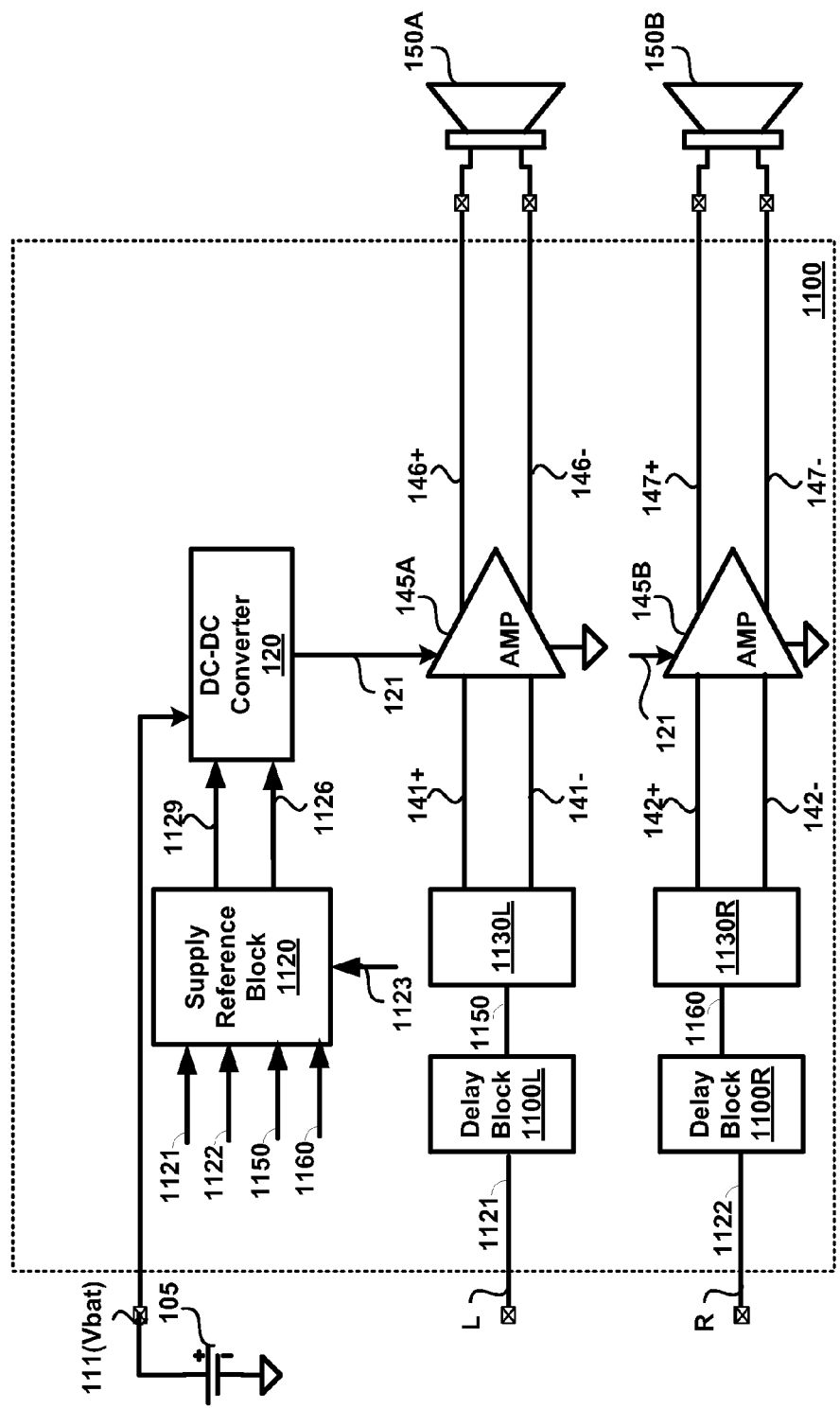
FIG. 11 is a block diagram of a power amplifier in an alternative embodiment of the present disclosure.

Power supply voltage 121 is provided as one input to comparator 730, while the other input to comparator 730 is control signal 162. It is noted here that when headroom tracker 130 is not implemented (such as in the embodiment of FIG. 1), comparator 730 receives control signal 116 instead of control signal 162. In the implementation of FIG. 11 (described below), comparator 730 receives control signal 1126 (FIG. 11) instead of control signal 162.

When the (instantaneous) voltage of control signal 162 is greater than the (instantaneous) magnitude of supply 121, output 731 of comparator 730 goes high. The rising edge of signal 731 initiates a 'charge phase' by turning ON (i.e., closing) switches 701 and 703, and turning OFF (i.e., opening) switches 702 and 704. The charge phase is enabled for a fixed time TON. Once the charge phase ends, a 'dump phase' is initiated by turning ON switches 702 and 704, and turning OFF switches 701 and 703. Switches 702 and 704 remain ON, and switches 701 and 703 remain OFF until a next rising edge of signal 731 occurs, and the cycle of charge phase and dump phase may repeat.

The control of switches 701-704 in the two phases as described above operates DC-DC converter 120 in what is termed as a buck-boost mode. As is well known in the relevant arts, in buck-boost mode, DC-DC converter 120 can generate power supply voltage 121 to have values greater than, equal to, or less than the magnitude of battery voltage Vbat (111).

The inductor current in DC-DC converter 120 can be in Continuous Conduction Mode (CCM) or Discontinuous Conduction Mode (DCM). During the dump phase, if the inductor current tries to go to a value below zero, switches 702 and 704 are turned OFF to prevent the inductor current from going below zero, to prevent efficiency loss. During DCM operation, if the amount of current built in the inductor is too large compared to the load current, it may lead to a larger ripple at the output. Larger ripple generally means that there is more power supply headroom in amplifiers 145A and 145B than may be required, and may thus lead to efficiency loss. To avoid such efficiency loss, in an embodiment the fixed time TON is varied based on the magnitude of the output signals (146+/146− and/or 147+/147−). In another embodiment, TON is varied based on the amplitude of control signal 162 (which itself is based on the magnitude of the audio output signals, as described above).

In an embodiment, DC-DC converter 120 is designed to be configurable (on the fly) to operate either as a buck-only, as a buck-boost, or as a boost-only converter. Such operation as buck-only, buck-boost, or as a boost-only converter can be achieved by operating the corresponding ones of switches 701-704 to open/close in a desired corresponding sequence in corresponding charge and dump phases, as is well known in the relevant arts.

Operation of DC-DC converter 120 in buck-boost mode has been described above. For operation in boost-only mode, switch 701 is always ON, switch 702 is always OFF, and switch 703 is turned ON in the charge phase (switch 704 being OFF in the charge phase) and switch 704 is turned ON in the dump phase (switch 703 being OFF in the dump phase). In buck-only mode, switches 701 and 702 operate as in buck-boost mode (described above), switch 704 is always ON and 703 is always OFF. In the embodiment of FIG. 10, the transition from one mode to another (e.g., from buck to boost, or boost to buck) may be performed by DC-DC converter 120 in response to signal 139 (which could be derived, for example, from signal 312 of FIG. 3) generated by headroom tracker 130, but not shown in FIG. 3.

In the implementation of FIG. 1, DC-DC converter 120 operates in buck-boost mode, and is capable of generating regulated power supply output 121 with magnitudes greater than, less than or equal to Vbat. When designed to operate in buck-boost, signal 119 is not generated. In another embodiment, DC-DC converter 120 is implemented to operate in buck-only and boost-only modes and is designed to transition from one mode to another (from buck to boost, or boost to buck) in response to signal 119 generated by DC-DC reference 110. DC-DC reference 110 may generate signal 119, for example, by adding a value to signal 613 of FIG. 6, with the magnitude of the added value being based on the voltage gain provided for the input audio signals.

In the embodiment of FIG. 11 (described below), signal 1129 (and additionally a signal derived from signal 1223, as noted below) determine(s) the mode (buck or boost) in which DC-DC converter 120 is to operate. Signals 119, 1129, 139 may be viewed as a mode select signals. Signal 791 represents the corresponding one of mode select signals 139, 119, and 1129 depending on which of the embodiments (of FIGS. 1, 10 and 11) DC-DC converter 120 is used in. When DC-DC converter 120 is used in the embodiment of FIG. 11, signal 791 is also deemed to contain a signal derived from signal 1223 (in addition to signal 1129), as also noted below.

The ability to operate in buck or boost mode ensures that appropriate values (amplitude) of power supply voltage 121 are generated when the amplitude of the greatest (maximum) of the output audio signals is greater than, equal to or less than Vbat (111). Therefore, power supply modulation is enabled to be performed when the amplitude of the greatest (maximum) of the output audio signals is greater than Vbat (111) as well as when the greatest (maximum) of the output audio signals is equal to or less than Vbat (111).

The specific range of values of voltages of the greatest (maximum) of the output audio signals that are greater than Vbat (and thus the range of values of supply 121 greater than Vbat) for which continuous power supply modulation (as illustrated in FIG. 2 and described in detail above) is performed by DC-DC converter 120 may be designed to be the entire range from Vbat to the maximum power supply voltage value that DC-DC converter 120 can generate, or only a specific portion in the range from Vbat to the maximum power supply voltage value that DC-DC converter 120 can generate.

Similarly, the specific range of values of voltages of the greatest (maximum) of the output audio signals that are less than Vbat (and thus the range of values of supply 121 less than Vbat), for which continuous power supply modulation is performed by DC-DC converter 120 may be designed to be the entire range from Vbat to zero volts, or only a specific portion in the range from Vbat to zero volts. For voltages of the greatest (maximum) of the output audio signal lying outside the specific portions, supply 121 may not be modulated and may instead be maintained at a constant value.

Error signal 132 (FIG. 3) when asserted (active) causes DC-DC converter 120 to provide a fixed value of power supply voltage or to operate in class G mode, as noted above. In an embodiment, assertion of signal 132 is designed to cause DC-DC reference 110 and headroom tracker 130 to generate respective signals 116 and 136 with fixed/constant value, thereby resulting in signal 162 having a fixed value. With control signal 162 being a fixed value, power supply voltage 121 is also a constant voltage. The constant/fixed value of power supply voltage 120 may be selected, for example, to be the maximum voltage that DC-DC converter 120 is designed to generate. Alternatively, the constant value can be any other voltage such that no clipping of the output signals can occur.

5. Output Common-Mode Control

As noted above, in an embodiment, linear amplifiers 145A and 145B (FIG. 1) are designed to operate from a single supply. Operation from a single supply implies that none of the output voltages on paths 146+, 146−, 147+ and 147− can take on values less than ground (199), i.e., less than zero volts. Hence, in order to provide differential output signals to speakers 150A and 150B, the output terminals 146+, 146−, 147+ and 147− are biased at a non-zero positive voltage, i.e., the output common mode of each of linear amplifiers 145A and 145B is set to a positive value. When power supply voltage 121 is negative (compared to ground), such output common mode may be set to a corresponding non-zero negative value.

If amplifier 145A operates using both positive and negative power supplies (not shown), the common mode of the output of amplifier 145A is set at ground (zero volts), and each of the positive and negative supplies is modulated according to either or both of signals 141+/141− and 146+/146−, as described above. However, additional external components may be needed to generate a negative supply rail that can sink large currents as needed by amplifiers 145A/145B. It is hence preferred to operate each of amplifiers 145A and 145B between positive supply (only) and ground, with the positive supply (121) modulated as described above. Since the supply to the amplifiers is modulated, the output common mode of amplifiers 145A/145B also needs to change in such a way that the signal at the amplifier output rides midway between the supply and ground. Hence, the output common mode voltage of the amplifier (145A/145B) may need to be implemented such that it is at half of the supply. The corresponding single ended and differential waveforms are illustrated in the example of FIG. 2 (waveforms 141+, 141− and 220).

Figure 8:
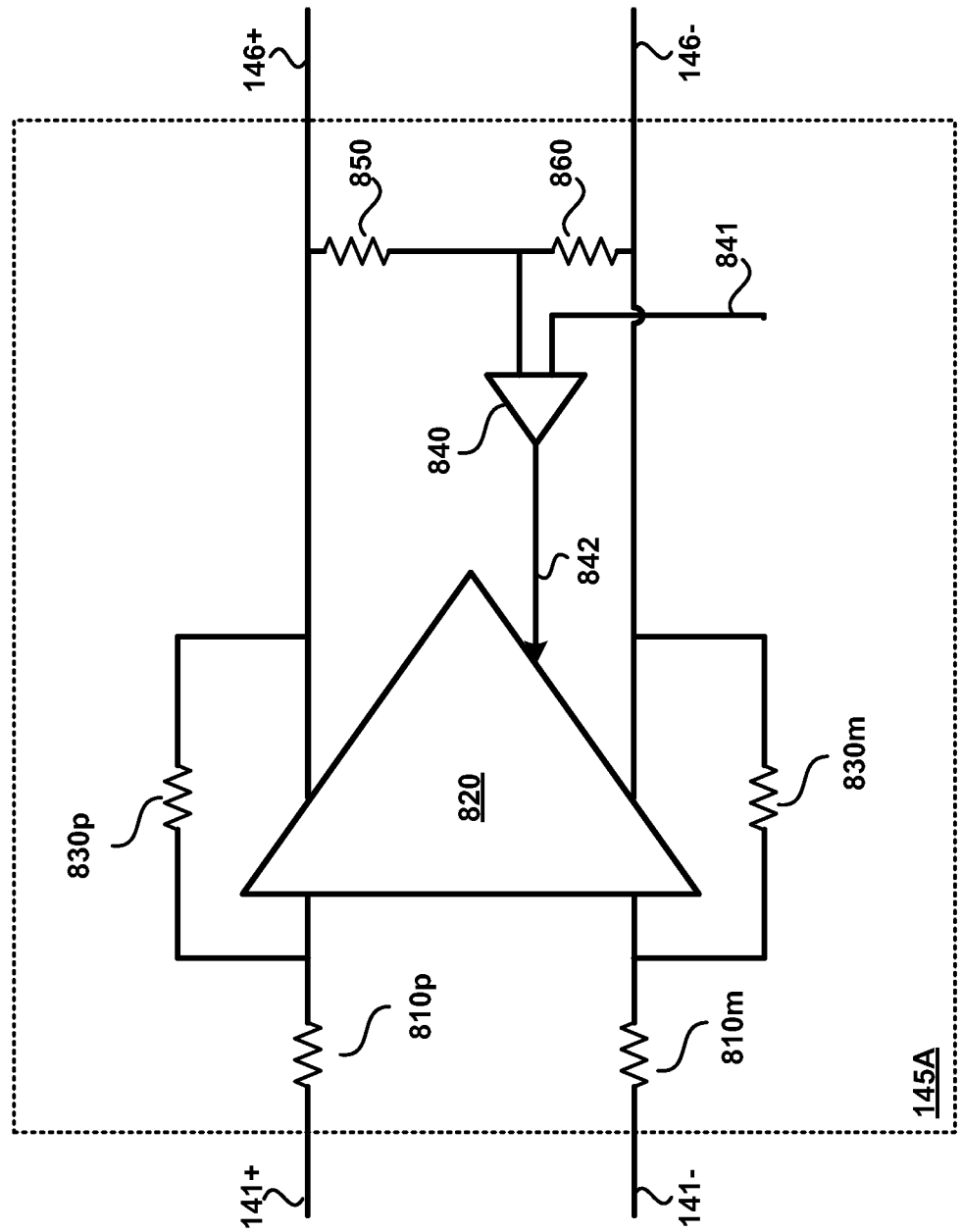
FIG. 8 is a diagram illustrating the manner in which the output common mode voltage for an amplifier used in a power amplifier is set in an embodiment of the present disclosure.

The manner in which the output common mode voltage for biasing the output terminals of linear amplifier 145A is generated in an embodiment is illustrated in the diagram of FIG. 8. Single-supply operation is assumed in the example of FIG. 8. The output common mode voltage is the magnitude of voltage that is common to each of differential output terminals 146+ and 146−. Resistors 810p, 810m, 830p and 830m are used to set the gain of amplifier 820, which may for example be implemented as an operational amplifier. Resistors 850 and 860 are equal-valued resistors and the voltage at the junction of the two resistors always equals half the output voltage across differential terminals 146+ and 146−.

Amplifier 840 receives the voltage at the junction and a voltage 841 (which may be designed to be equal to half of power supply voltage 121 or equal to voltage 162), and provides, as output 842, the amplified difference of the two voltages as the common mode voltage to be set at the common mode bias node of amplifier 820. The output common mode voltage continuously changes with respect to magnitude of output signal 146+/146−. The setting of the output common mode voltage as described above enables a differential output (without distortion/clipping) to be generated by amplifier 145A even when operated using a single supply. The output common mode voltage of amplifier 145B is set in a similar manner.

The description above is provided with respect to analog audio signals as received on paths (IC pins) L+/L− and R+/R−. In another embodiment, the input audio signals corresponding to the left and right channels are received in digital form.

Figure 9B:
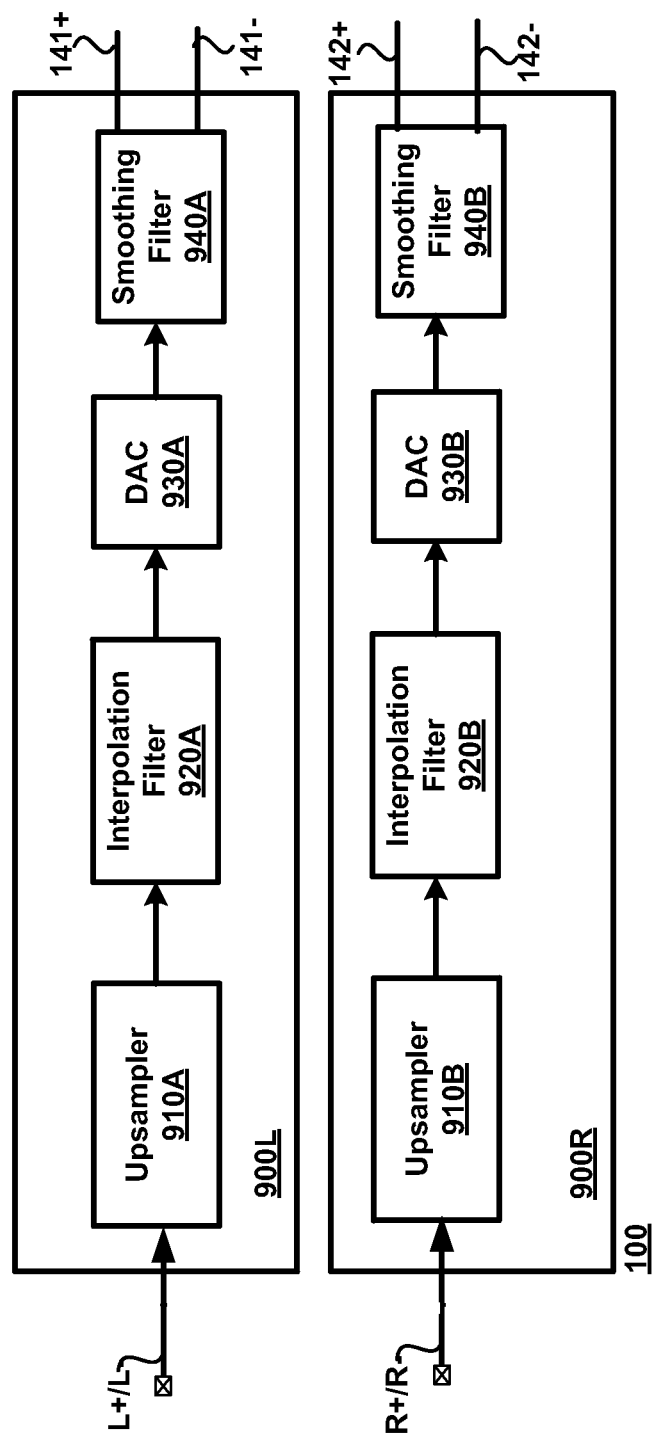
FIG. 9B is a diagram illustrating the relevant details of a portion of a power amplifier that processes digital audio data, in an embodiment.

FIG. 9B is a diagram showing portions of IC 100 in another embodiment, in which the audio inputs corresponding to the left and right channels are received in digital form. Digital samples representing audio are received on left (L+/L−) and right (R+/R−) terminals, respectively corresponding to the left and right channels of the audio. In an embodiment, the audio data received on the left and right terminals are according to I²S format. FIG. 9B is shown containing upsamplers 910A and 910B, interpolation filters 920A and 920B, digital to analog converters (DAC) 930A and 930B and smoothing filters 940A and 940B. The combination of an upsampler, an interpolation filter, a DAC and a smoothing filter of FIG. 9B is referred to herein as a conversion block 900. Thus, two conversion blocks 900L and 900R may be used, one each for the left and right channels, as shown in FIG. 9B. The left and right audio inputs, as well as one or more of the paths between the components of the conversion blocks may be single-ended or differential.

Upsampler 910A receives the digital samples on differential terminal pair L+/L−, and performs upsampling on the samples. As is well known in the relevant arts, upsampling is a process by which the sampling rate of a signal is increased. Typically, one or more samples are inserted between successive samples of the (original) received digital samples (path L+/L−) to achieve the upsampling. Upsampler 910 forwards the upsampled audio data to interpolation filter 920A.

Interpolation filter 920A receives the upsampled audio data and removes undesired spectral components, and band-limits the signal to desired audio band so images do not fold back into audio range and reduce dynamic range. Interpolation filter 920A forwards the filtered audio signal to DAC 930A.

DAC 930A converts the received digital samples to a corresponding analog signal, and forwards the analog signal to smoothing filter 940A. In an embodiment, DAC 930A is implemented as a sigma-delta DAC. Smoothing filter 940 is used to filter the high frequency content of the output of DAC 930A, and to generate a smooth analog signal from the output of DAC 930A. The resulting analog signal may be provided in differential form on differential paths 141+/141−.

Upsampler 910B, interpolation filter 920B, DAC 930B and smoothing filter 940B are each implemented similar to (and operate identically as) upsampler 910A, interpolation filter 920A, DAC 930A and smoothing filter 940A, and operate to process the right channel of the audio data.

The analog signals on paths 141+/141− and 142+/142− may be processed in a manner described in detail above. The equivalent of the gain provided by corresponding pre-amplifiers 140A and 140B of FIG. 1, may be provided in the embodiment of FIG. 10 by the corresponding DAC.

It is noted that in other embodiments, any one of the L+/L− and R+/R− inputs, outputs of interpolation filters 920A/920B or the outputs DACs 930A/930B may instead (of signals 141+/141−, 142+/142−) may provided as inputs to DC-DC reference 110, which may be suitably modified to enable processing of the corresponding inputs.

The description is continued with an illustration of another embodiment of the present disclosure.

6. Digital Control

FIG. 11 is a block diagram of a power amplifier in an alternative embodiment of the present disclosure. FIG. 11 is shown containing power amplifier 1100, battery 105 and speakers 150A and 150B. Power amplifier 1100 is shown containing supply reference block 1120, delay blocks 1100L and 1100R, conversion blocks 1130L and 1130R, DC-DC converter 120, and linear amplifiers 145A and 145B.

Again, two channels (left and right) are shown in FIG. 11, merely for illustration. In other embodiments, power amplifier 1100 may be implemented to have blocks necessary for amplification of one audio channel only. Similarly, although some of the signal paths are shown as differential, such paths may be implemented as single-ended signal paths as well, and vice versa. Although not indicated in FIG. 11, operations of blocks 1100L, 1100R, 1130L, 1130R and corresponding portions of supply reference block 1120 may be performed synchronized with respect to active edges of a master clock 1123. Although not shown as such for ease of description, master clock 1123 may also be provided to blocks 1100L, 1100R, 1130L, 1130R.

Linear amplifiers 145A and 145B and speakers 150A and 150B operate similar to similarly named/numbered components of FIG. 1 and/or FIG. 10, and their description is not repeated here in the interest of conciseness.

DC-DC converter 120 operates as described above to generate power supply 121 with a magnitude that is modulated based on reference signal 1126. DC-DC converter 120 receives a signal 1129 from supply reference block 1120 specifying the mode (buck or boost) in which DC-DC converter 120 should operate in. DC-DC converter 120 may be implemented with a gain to ensure that, in conjunction with the control provided by signal 1126, the regulated supply 121 tracks (the instantaneous maximum) of output signals 146+/146− and 147+/147− with a desired headroom (described below).

Delay block 1100L receives digital samples (data) on terminal 1121, representing the left channel audio input, and forwards the digital samples with a delay on path 1150. The specific value of delay provided by delay block 110L may be programmable via terminals not shown. In one embodiment, the delay provided by delay block 1100L is of the order of tens of microseconds. Thus, each sample received on input 1121 is forwarded on path 1150 with a delay. The delay may be the same for all samples.

Delay block 1100R receives digital samples (data) on terminal 1122, representing the right channel audio input, and forwards the digital samples with a delay on path 1160. The specific value of delay may be programmable via terminals not shown. In one embodiment, the delay provided by delay block 1100R is of the order of tens of microseconds. Thus, each sample received on input 1122 is forwarded on path 1160 with a delay. The delay may be the same for all samples. Further, the delay for the left-audio-channel samples may be the same as that for the right-audio-channel samples. Delay blocks 1100L and 1100R may be implemented, for example, as by using flip-flops (or clocked storage element in general) and by controlling the clock rate.

Each of conversion blocks 1130L and 1130R is implemented similar/identical to blocks 900L or 900R. Thus, conversion block 1130L converts the delayed digital samples on path 1150 to a corresponding analog signal, and provides the analog signal in differential form across terminals 141+ and 141−. Similarly, conversion block 1130R converts the delayed digital samples on path 1160 to a corresponding analog signal, and provides the analog signal in differential form across terminals 142+ and 142−. Corresponding power-amplified audio output signals are thus generated and provided to respective speakers 150A and 150B, as also described in sections above.

Supply reference block 1120 receives the digital samples on paths 1121 and 1122, as well as the delayed digital samples on paths 1150 and 1160, processes the samples and generates control signal 1126 to control the magnitude of regulated power supply voltage 121, and mode select signal 1129 to select the mode (buck or boost) of operation of DC-DC converter 121.

The implementation and operation of supply reference block 1120 is described next with respect to an embodiment.

7. Supply Reference Block

Figure 12:
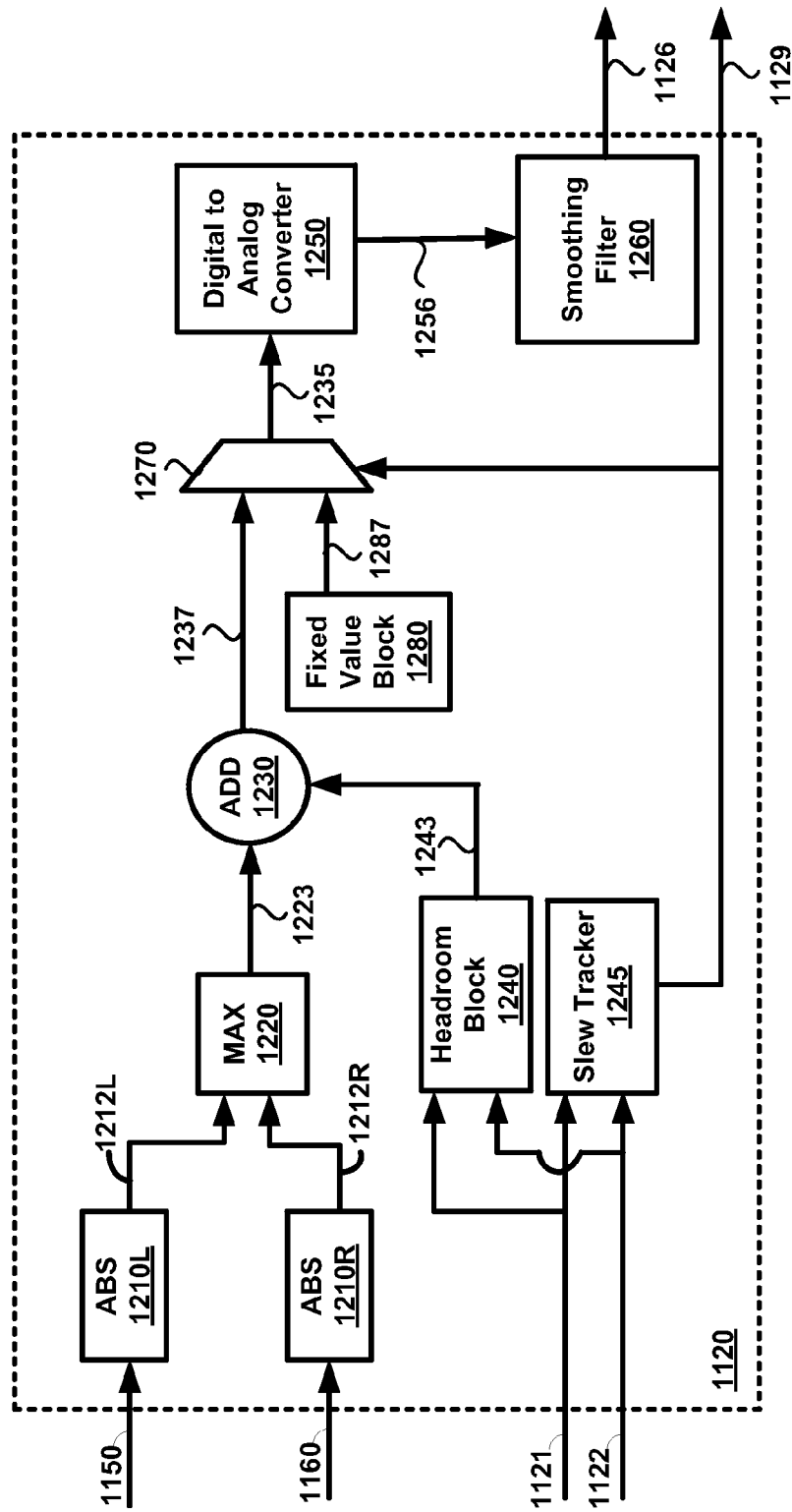
FIG. 12 is a block diagram illustrating the implementation details of a supply reference block in an embodiment of the present disclosure.

FIG. 12 is a block diagram of a supply control block used to control the regulated output of a DC-DC converter of a power amplifier in an alternative embodiment of the present disclosure. Supply reference block 1120 is shown containing absolute value determination blocks ABS 1210L and ABS 1210R, maximum value determination block MAX 1220, adder block ADD 1230, headroom block 1240, slew tracker 1245, digital to analog converter (DAC) 1250, smoothing filter 1260, multiplexer (MUX) 1270 and fixed value block 1280. The left-channel and right-channel audio input signals are assumed to be received in digital form (digital samples) on respective paths 1121 and 1122.

ABS 1210L computes the absolute value of a delayed digital sample received (e.g., at each active edge of master clock 1123) on path 1150 and forwards the absolute value on path 1212L. An absolute value refers to the magnitude portion of a quantity (here the digital sample representing an audio input signal), and ignores the sign (whether positive or negative). ABS 1210R computes the absolute value of a delayed digital sample received (e.g., at each active edge of clock 1123, noted above) on path 1160 and forwards the absolute value on path 1212R.

Corresponding to each pair of digital samples received on corresponding input paths 1212L and 1212R, MAX 1220 determines which sample of the pair has the greater magnitude, and forwards the magnitude of the greater-valued sample on path 1223.

Headroom block 1240 receives digital samples on paths 1121 and 1122, and operates to generate a headroom value on path 1243. In one embodiment, headroom block 1240 computes the peak-to-peak magnitudes (envelope) of each of signals 1121 and 1122, and generates headroom values accordingly. For example, if the greater of the two envelope values (one corresponding to signal 1121 and the other corresponding to signal 1122) equals 1V (one volt), headroom block 1240 generates headroom value 1243 with a magnitude of 50 mV. If the greater of the two envelope values equals 2V, headroom block 1240 generates headroom value 1243 with a magnitude of 100 mV, and so on. Other techniques for computing the headroom value may also be used as would be apparent to one skilled in the relevant arts upon reading the disclosure herein.

Slew tracker 1245 computes the rate of change (slew-rate) of each of the input audio signals represented by digital samples 1121 and 1122. Slew tracker 1240 may compute the slew-rate of an audio signal (represented by samples 1121 or 1122) by computing the difference between a current sample and a previous sample. Other techniques of determining the slew-rate may also be employed instead. Slew tracker 1245 compares the two slew rates (of signals 1121 and 1122) with a threshold value (set internally in slew tracker 1245). If the greater of the two slew rates is equal to or greater than the threshold value, slew tracker 1245 generates a digital signal at logic high on path 1129. If each of the two slew rates computed is less than the threshold value, slew tracker 1245 generates a digital signal at logic low on path 1129. Binary signal 1129 is provided as a select signal to MUX 1270. Signal 1129 when asserted (logic high) causes DC-DC converter 120 to operate in boost mode and to generate a fixed/constant value of regulated power supply 121, as described below. Thus, at high slew rates (as determined above), DC-DC converter 120 is operated in boost mode and to generate a fixed value of power supply 121 (for example, the largest value that can be generated for power supply voltage 121), thereby ensuring that signal clipping of any of the audio output signals does not occur.

When signal 1129 is not asserted (logic low), whether DC-DC converter 120 operates in buck mode or boost mode may be determined by signal derived from signal 1223 (though the connection of such a derived signal to DC-DC converter 120 is not shown in the interest of clarity). The derived signal may either be signal 1223 itself, or signal 1223 processed in some manner (for example, by addition of a constant value to signal 1223). Such derived signal may also be viewed as another mode select signal, and is assumed to be contained in path 791 (FIG. 7) as noted above. If the derived signal (which may be binary signal) indicates that the output of MAX 1220 is greater than or equal to Vbat (i.e., at least one of input signals 1121 or 1122 is greater than Vbat), then DC-DC converter 120 is operated in boost mode. If however, the derived signal indicates that the output of MAX 1220 is less than Vbat, then DC-DC converter 120 may be operated in buck mode or boost mode.

ADD 1230 adds headroom value 1243 to the digital value received on paths 1223, and generates a final digital value on path 1237. Fixed value block 1280 generates a digital code on path 1287 that corresponds to the fixed value of supply 121 that is to be generated when signal 1129 is asserted (described above). The digital code corresponds to a value of power supply 121 greater than Vbat (for example, the largest magnitude of supply 121).

MUX 1270 receives the digital values on path 1237 and 1287. When select signal 1129 is logic low, MUX 1270 forwards the digital values on path 1237 on path 1235. When select signal 1129 is logic high, MUX 1270 forwards the digital values on path 1287 on path 1235. The digital value (code) on path 1235 represents the reference voltage (including headroom) or a fixed voltage greater than Vbat (depending on the value of select signal 1129) to be applied to DC-DC converter 120.

DAC 1250 converts each digital value received on path 1235 to a corresponding analog signal, provided on path 1256. In an embodiment, DAC 1250 is implemented as a sigma-delta converter, and may be implemented in a known way. Smoothing filter 1260 may operate as a low-pass filter to smooth the output 1256 of DAC 1250, and provides the smoothed signal as reference signal 1126.

It may be appreciated that envelope tracker 1240 effectively 'looks-ahead' (due to the delay blocks 1100L and 1100R) at the input audio signals (represented by samples 1121 and 1122), and generates a corresponding headroom ahead in time compared to the 'present' maximum of the input audio signals. Due to such 'earlier-in-time' computation and application of the headroom, it may be ensured that supply 121 never falls below the current maximum of the audio output signals, and thus that distortion or clipping in the audio output signals never occurs.

While blocks 1240 and 1245 are described above as implemented within supply reference block 1120, in another embodiment, the blocks are implemented separate from supply reference block 1120, but within power amplifier 1100. In yet another embodiment, blocks 1240 and 1245 may not be implemented at all. In such an embodiment, a fixed value of headroom may be provided to ADD 1230 in place of signal 1243.

It may be observed that, similar to DC-DC reference 110 of FIG. 1, supply reference block 1120 is also coupled to receive signals representative of the magnitudes of input audio signals (L/R etc.), and to generate control signal 1126 to control the magnitude of the regulated power supply 121. In this document, the term 'control block' is used to refer to either one of DC-DC reference 110 and supply reference block 1120. It may also be appreciated that, in general, the magnitude of control signal 1126 generated by supply reference block 1120 has a positive correlation with respect to the magnitude of the larger of the two input audio signals 1121 and 1122, due to the operation of the blocks of FIG. 12 as described above.

It is noted here that while power amplifiers 100, 1000 and 1100 are shown as directly receiving 'raw' (unprocessed) input signals L and R (or L+/L− and R+/R−) corresponding to left and right audio channels, in other embodiments, power amplifiers 100, 1000 and 1100 may instead receive input signal(s) processed in some form (e.g., amplified, attenuated, delayed etc.). Thus, the term 'input signal' as used herein is meant to include both processed as well as unprocessed signals.

It is further noted that although power amplifiers 100, 1000 and 1100 are each shown containing components/blocks for processing both 'left' and 'right' audio channels, in other embodiments, the power amplifiers may be implemented to contain components/blocks for processing only a single (mono) channel. To illustrate with respect to power amplifier 100 for example, if the 'left' channel is the only channel implemented, DC-DC reference 110 receives only signal 141+/141−, and generates signal 116 having a positive correlation with signal 141+/141−. Similarly, in power amplifier 1000, headroom tracker 130 may receive only signal 146+/146−, and generates signal 136 having a positive correlation with signal 146+/146−. Accordingly, max generators 310 and 610 may be suitably modified for such operation. Similarly, supply reference block 1120 may also be suitably modified. For example, when only one audio channel is required to be processed, only one of ABS 1210L and 1210R may be implemented, and MAX 1220 may not be implemented. Envelope tracker 1240 may be designed to compute the slew-rate of the audio input of only one channel instead of both as described above with respect FIG. 12.

In yet another embodiment, IC 100 (as well as ICs 1000 and 1100) may be implemented with more than two linear amplifiers (such as 145A and 145B), each powered by power supply voltage 121, and used for amplifying a corresponding audio signal. In such an embodiment, power supply voltage 121 may be designed to track the maximum of the outputs of the multiple linear amplifiers.

Further, although in the Figures signal paths (L+/L−, 141+/141−, 146+, 146−, etc.) are shown to be differential, in other embodiments, the signal paths may be single-ended. Further still, while most of the description above is provided with respect to modulation of a power supply voltage in the context of single-supply operation of linear amplifiers 145A/145B (from a positive or negative supply with respect to ground), similar techniques can also be implemented in the context of dual-supply operation in which one or both of linear amplifiers 145A/145B operate from both positive and negative power supplies. In such dual-supply operation scenarios, modulation of both the positive and negative power supplies may be performed in the manner described above, with suitable modifications/additions to the corresponding blocks/circuits.

A power amplifier implemented as described above may be incorporated in a system/device, as illustrated next with respect to an example device.

8. Device/System

Figure 13:
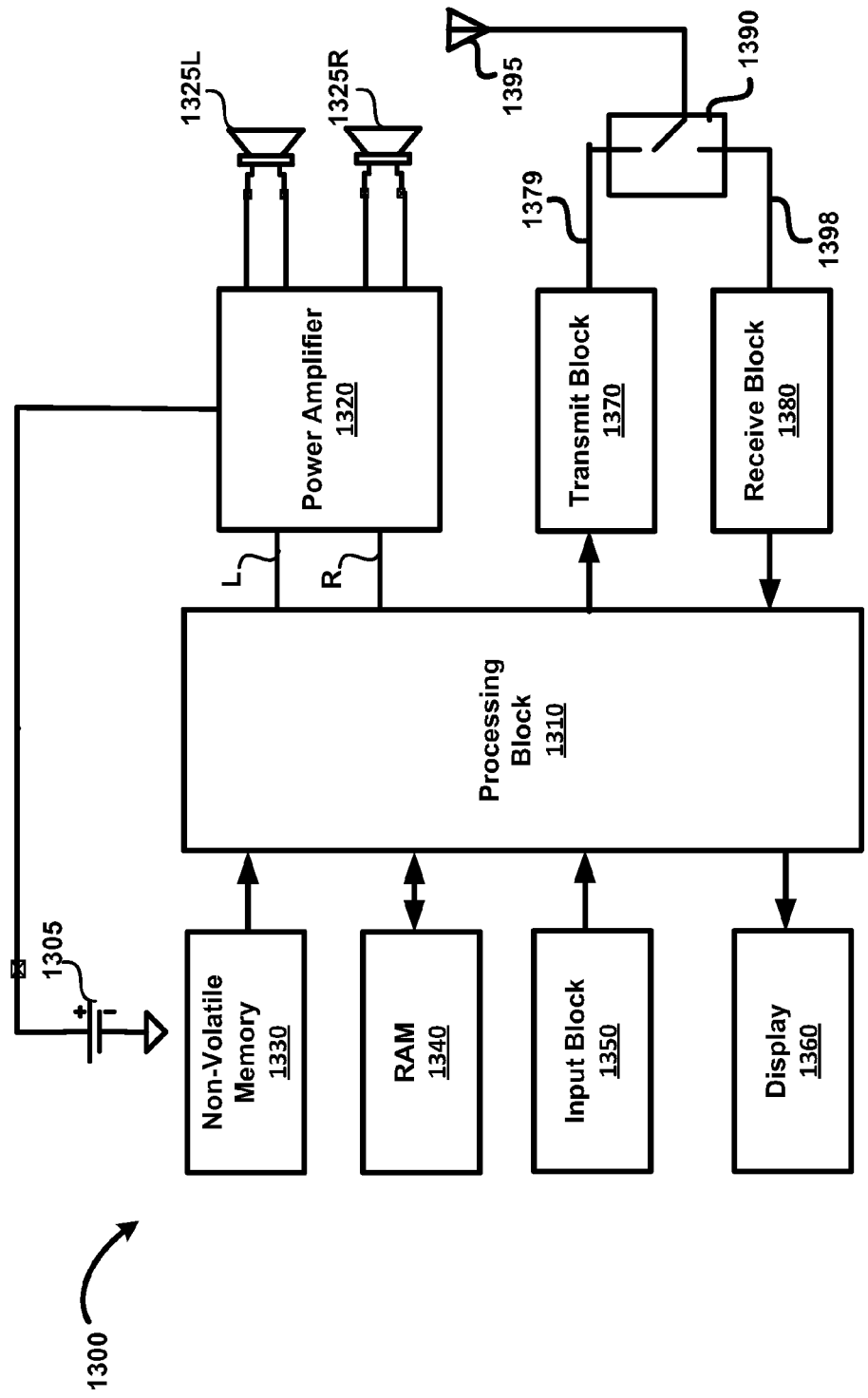
FIG. 13 is a block diagram of a device/system incorporating a power amplifier implemented according to several aspects of the present disclosure.

FIG. 13 is a block diagram showing the implementation details of a device/system in an embodiment of the present disclosure. Mobile phone 1300 is shown containing battery 1305, processing block 1310, power amplifier 1320, speakers 1325L and 1325R, non-volatile memory 1330, random access memory (RAM) 1340, input block 1350, display 1360, transmit block 1370, receive block 1380, switch 1390 and antenna 1395. The specific components/blocks of mobile phone 1300 are shown merely by way of illustration. However, mobile phone 1300 may contain more or fewer components/blocks.

Battery 1305 represents an unregulated power supply, used to power the various blocks of mobile phone 1300. Although not indicated, one or more of blocks other than power amplifier 1320 may receive power for operation from battery 1305 via corresponding regulated power supplies (not shown, but which could be, for example, implemented as linear regulators).

Power amplifier 1320 may represent any of power amplifiers 100, 1000 and 1100 described in detail above. Thus, a DC-DC converter within power amplifier 1320 receives an unregulated supply from battery 1305 (or power from a power source in general), and generates a regulated power supply according to several aspects of the present disclosure. The regulated power supply generated by the DC-DC converter may be used to power linear amplifiers within power amplifier 1320, the linear amplifiers being used to power-amplify corresponding input signals received on paths L and R.

In FIG. 13, the signals on paths L and R are assumed to be digital signals representing the left and right audio channels of an audio system. Power amplifier 1320 generates corresponding power-amplified outputs to drive respective speakers 1325L and 1325R. Although power amplifier 1320 is noted as receiving input signals from processing block 1310 in digital form, in another embodiment power amplifier 1320 receives input signals from processing block 1310 in analog form, the digital to analog conversion of the corresponding digital signals being performed within a digital to analog converter within processing block.

Processing block 1310 may store speech and/or audio signals that are represented by the signal provided as input (whether in analog from or digital form) to power amplifier 1320 on paths L and R in the form of files in non-volatile memory 1330. Such files may be input to mobile phone 1300 via input block 1350 or received via receive block 1380 and antenna 1395.

Input block 1350 represents one or more input devices used to provide user inputs to mobile phone 1300. Input block 1350 may include a keypad, microphone, etc. Display 1360 represents a display screen (e.g., liquid crystal display) to display images generated by processor 1310.

Antenna 1395 operates to receive from and transmit to a wireless medium, corresponding wireless signals carrying speech and/or audio. Switch 1390 may be controlled by processing block 1310 (connection not shown) to connect antenna 1395 either to receive block 1380 via path 1398, or to transmit block 1370 via path 1379, depending on whether mobile phone 1300 is to receive or transmit wireless signals.

Transmit block 1370 receives data/speech/audio (information signal in general) to be transmitted from processing block 1310, generates a radio frequency (RF) signal modulated by the information signal according to corresponding standards such as GSM, CDMA, etc., and transmits the RF signal via switch 1390 and antenna 1395. Receive block 1380 receives an RF signal bearing an information signal via switch 1390, path 1398 and antenna 1395, demodulates the RF signal, and provides the extracted information (speech/audio/data) to processing block 1310.

Non-volatile memory 1330 is a non-transitory machine readable medium, and stores instructions, which when executed by processing block 1310, causes mobile phone 1300 to provide several features. RAM 1330 is a volatile random access memory, and may be used for storing instructions and data.

Processing block 1310 (or processor in general) may contain multiple processing units internally, with each processing unit potentially being designed for a specific task. Alternatively, processing block 1310 may contain only a single general-purpose processing unit. Processing block 1310 may execute instructions stored in non-volatile memory 1350 or RAM 1330 to enable mobile phone 1300 to operate to provide various features.

9. CONCLUSION

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1 through 13, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. An Integrated Circuit (IC) comprising:
   a DC-DC converter coupled to receive power from a power source and to generate a regulated power supply voltage as output, wherein a magnitude of said regulated power supply voltage is controlled by the magnitude of a control signal provided to said DC-DC converter;
   a first linear amplifier coupled to receive a first input signal, said first input signal varying in amplitude continuously in each of a sequence of time intervals, said first linear amplifier designed to amplify said first input signal to generate a power-amplified output signal, said power-amplified output signal also varying in amplitude continuously in each of said sequence of time intervals, wherein said first linear amplifier is coupled to receive said regulated power supply voltage for operation; and
   a control block coupled to receive said first input signal, and to generate said control signal with a magnitude having positive correlation with instantaneous amplitude of said first input signal,
   wherein the operation of said control block in conjunction with said DC-DC converter causes said regulated power supply voltage to continuously track instantaneous values of amplitude of said power-amplified output signal in each of said sequence of time intervals such that a difference of instantaneous amplitude of said regulated power supply and said power-amplified output signal is sought to be maintained constant throughout all of said sequence of time intervals,
   wherein said regulated power supply voltage continuously tracks said amplitude of said power-amplified output signal when the amplitude of said power-amplified output signal is in a first range less than a magnitude of said power source, as well as when the amplitude of said power-amplified output signal is in a second range greater than or equal to said magnitude of said power source.

2. The IC of claim 1, wherein said DC-DC converter is designed to operate in a buck mode in one range of instantaneous values of said amplitude of said power-amplified output signal, and in a boost mode in another range of instantaneous values of said amplitude of said power-amplified output signal, wherein said one range equals said first range and said another range equals said second range.

3. The IC of claim 2, wherein said control block generates a mode select signal indicating whether said DC-DC converter is to operate in said buck-mode or said boost-mode,
wherein said DC-DC converter is coupled to receive said mode select signal, and to operate in said buck-mode or said boost-mode based on the indication of said mode select signal,
whereby said regulated power supply voltage is enabled to continuously track said amplitude of said power-amplified output signal when the instantaneous value of said amplitude of said power-amplified output signal is in said first range, as well as when the instantaneous value of said amplitude of said power-amplified output signal is in said second range.

4. The IC of claim 3, wherein said control block is designed to compute an instantaneous amplitude of said first input signal, said IC further comprising:
a headroom tracker coupled to said power-amplified output signal, said headroom tracker block to generate a headroom value; and
a summation block,
wherein said summation block, instead of said control block, generates said control signal, said summation block to generate a sum of said headroom value and said instantaneous amplitude of said first input signal as said control signal.

5. The IC of claim 4, wherein said first input signal is a first audio signal representing a left channel of an audio system, said IC further comprising:
a second linear amplifier coupled to receive a second audio signal representing a right channel of said audio system, said second linear amplifier designed to amplify said second audio signal to generate another power-amplified output signal, wherein said second linear amplifier is coupled to receive said regulated power supply voltage for operation,
wherein said headroom tracker is coupled to said another power-amplified output signal,
wherein said headroom tracker comprises:
a maximum generator block to determine the greater of the instantaneous amplitudes of said power-amplified output signal and said another power-amplified output signal;
a subtraction block to generate a difference voltage between a magnitude of said regulated power supply voltage and said greater of the instantaneous amplitudes; and
an amplifier coupled to receive said difference voltage and a reference headroom voltage, and to generate said headroom value based on the difference between said difference voltage and said reference headroom voltage.

6. The IC of claim 5, wherein said headroom tracker further comprises:
a comparator to compare said difference voltage and a threshold headroom voltage, and to generate a binary value representing a comparison of said difference voltage and said threshold headroom voltage; and
a storage element to store said binary value,
wherein if said binary value indicates that said difference voltage is less than said threshold headroom voltage, said DC-DC converter is designed to either transition to class G operation or to generate said regulated power supply voltage with a fixed value.

7. The IC of claim 6, further comprising a conversion block to receive a sequence of digital samples representing an analog signal, said conversion block to generate a corresponding analog signal as said input signal.

8. The IC of claim 3, further comprising:
a delay block coupled to receive a sequence of digital samples representing an analog signal, said delay block designed to delay each sample in said sequence of digital samples by a delay value, and to generate a sequence of delayed digital samples; and
a conversion block coupled to receive said sequence of delayed digital samples and to generate a corresponding analog signal as said first input signal,
wherein said control block comprises:
a first absolute value computation block coupled to receive said sequence of delayed digital samples, and to generate an absolute value of each sample in said sequence;
a digital to analog converter (DAC) is coupled to receive said absolute value and to convert said absolute value to a second analog signal; and
a smoothing filter coupled to receive said second analog signal, said smoothing filter designed to low-pass filter said second analog signal to generate a filtered signal,
wherein said filtered signal is provided as said control signal.

9. The IC of claim 8, wherein said control block further comprises:
a headroom block coupled to receive said sequence of digital samples, said headroom block designed to generate a headroom value based on the envelope of the signal represented by said sequence of digital samples;
an adder block coupled to receive said headroom value and said absolute value, said adder block designed to generate a sum of said headroom value and said absolute value,
wherein said DAC is coupled instead to receive said sum and to convert said sum to said second analog signal.

10. The IC of claim 9, wherein said control block further comprises:
a slew tracker coupled to receive said sequence of digital samples, said slew tracker designed to determine a slew rate of the signal represented by said sequence of digital samples,
wherein, if said slew rate is greater than a threshold value, said DAC is coupled instead to receive a fixed code value and to convert said fixed code value to said second analog signal,
wherein, if said slew rate is greater than said threshold value, said DC-DC converter is operated in said boost mode.

11. The IC of claim 10, wherein said first input signal is a first audio signal representing a left channel of an audio system, said IC further comprising:
a second linear amplifier coupled to receive a second audio signal representing a right channel of said audio system, said second linear amplifier designed to amplify said second audio signal to generate another power-amplified output signal, wherein said second linear amplifier is coupled to receive said regulated power supply voltage for operation;
a second delay block coupled to receive a second sequence of digital samples representing said second audio signal, said second delay block designed to delay each sample in said second sequence of digital samples by said delay value, and to generate a second sequence of delayed digital samples; and
a second conversion block coupled to receive said second sequence of delayed digital samples and to generate said second audio signal,
wherein said control block further comprises:
a second absolute value computation block coupled to receive said second sequence of delayed digital samples, and to generate a second absolute value of each sample in said second sequence; and
a maximum value computation block to receive each of said absolute value and said second absolute value, and to a determine the greater of said absolute value and said second absolute value;
wherein said headroom block is coupled to receive said second sequence of digital samples, said headroom block designed, said headroom block designed to generate said headroom value based on the greater of the two envelopes of the respective signals represented by said sequence of digital samples and said second sequence of digital samples,
wherein said adder block is coupled instead to receive said greater of said absolute value and said second absolute value instead of said absolute value.

12. The IC of claim 11, wherein each of said first input signal, said power-amplified output signal, said second audio signal and said another power-amplified output signal is a differential signal.

13. The IC of claim 1, wherein said first linear amplifier is a single-supply amplifier powered only by said regulated power supply voltage, wherein each of said input signal and said power-amplified output signal is a differential signal, said first linear amplifier comprising:
a differential amplifier coupled to receive said input signal, and to provide said power- amplified output signal;
a first pair of resistors and a second pair of resistors to set a gain of said differential amplifier;
a third resistor and a fourth resistor coupled in series between a pair of output terminals across which said differential amplifier provides said power-amplified output signal;
a second differential amplifier coupled to receive a first voltage at a junction of said third resistor and said fourth resistor as one input, and a second voltage equal in magnitude to half the magnitude of said regulated power supply as a second input, wherein an output of said second differential amplifier sets a magnitude of a common mode voltage at each one of said pair of output terminals.

14. A device comprising:
a battery, a speaker, a processing block and an integrated circuit (IC), wherein said IC comprises:
a DC-DC converter coupled to receive power from said battery and to generate a regulated power supply voltage as output, wherein a magnitude of said regulated power supply voltage is controlled by the magnitude of a control signal provided to said DC-DC converter;
a first linear amplifier coupled to receive a first input signal from said processing block, said first input signal varying in amplitude continuously in each of a sequence of time intervals, said first linear amplifier designed to amplify said first input signal to generate a power-amplified output signal, said power-amplified output signal also varying in amplitude continuously in each of said sequence of time intervals, wherein said first linear amplifier is coupled to receive said regulated power supply voltage for operation, wherein said power-amplified output signal is coupled to drive said speaker; and
a control block coupled to receive said first input signal, and to generate said control signal with a magnitude having positive correlation with instantaneous amplitude of said first input signal,
wherein the operation of said control block in conjunction with said DC-DC converter causes said regulated power supply voltage to continuously track instantaneous values of amplitude of said power-amplified output signal in each of said sequence of time intervals such that a difference of instantaneous amplitude of said regulated power supply and said power-amplified output signal is sought to be maintained constant throughout all of said sequence of time intervals,
wherein said regulated power supply voltage continuously tracks said amplitude of said power-amplified output signal when the amplitude of said power-amplified output signal is in a first range less than the voltage output by said battery, as well as when the amplitude of said power-amplified output signal is in a second range greater than or equal to the voltage output by said battery.

15. The device of claim 14, wherein said device is a mobile phone.

16. The device of claim 15, wherein said DC-DC converter is designed to operate in a buck mode in one range of instantaneous values of said amplitude of said power- amplified output signal, and in a boost mode in another range of instantaneous values of said amplitude of said power-amplified output signal, wherein said one range equals said first range and said another range equals said second range.

17. The device of claim 16, wherein said control block generates a mode select signal indicating whether said DC-DC converter is to operate in said buck-mode or said boost-mode,
wherein said DC-DC converter is coupled to receive said mode select signal, and to operate in said buck-mode or said boost-mode based on the indication of said mode select signal,
whereby said regulated power supply voltage is enabled to continuously track said amplitude of said power-amplified output signal when the instantaneous value of said amplitude of said power-amplified output signal is in said first range, as well as when the instantaneous value of said amplitude of said power-amplified output signal is in said second range.

18. The device of claim 17, wherein said IC further comprises:
a delay block coupled to receive a sequence of digital samples representing an analog signal, said delay block designed to delay each sample in said sequence of digital samples by a delay value, and to generate a sequence of delayed digital samples; and
a conversion block coupled to receive said sequence of delayed digital samples and to generate a corresponding analog signal as said first input signal,
wherein said control block comprises:
a first absolute value computation block coupled to receive said sequence of delayed digital samples, and to generate an absolute value of each sample in said sequence;
a digital to analog converter (DAC) is coupled to receive said absolute value and to convert said absolute value to a second analog signal; and a smoothing filter coupled to receive said second analog signal, said smoothing filter designed to low-pass filter said second analog signal to generate a filtered signal, wherein said filtered signal is provided as said control signal.

19. The device of claim 18, wherein said control block further comprises:

a headroom block coupled to receive said sequence of digital samples, said headroom block designed to generate a headroom value based on the envelope of the signal represented by said sequence of digital samples;

an adder block coupled to receive said headroom value and said absolute value, said adder block designed to generate a sum of said headroom value and said absolute value, wherein said DAC is coupled instead to receive said sum and to convert said sum to said second analog signal.

* * * * *